US008724395B2

(12) United States Patent
Park et al.

(10) Patent No.: US 8,724,395 B2
(45) Date of Patent: May 13, 2014

(54) NONVOLATILE MEMORY DEVICE AND RELATED PROGRAMMING METHOD

(75) Inventors: Sang-Soo Park, Hwaseong-si (KR); Jae-Yong Jeong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 58 days.

(21) Appl. No.: 13/483,308

(22) Filed: May 30, 2012

(65) Prior Publication Data

US 2013/0033938 A1 Feb. 7, 2013

(30) Foreign Application Priority Data

Aug. 3, 2011 (KR) .................. 10-2011-0077371

(51) Int. Cl.
*G11C 11/34* (2006.01)
(52) U.S. Cl.
USPC ................................. 365/185.22; 365/185.24
(58) Field of Classification Search
USPC ....................................... 365/185.22, 185.24
See application file for complete search history.

(56) References Cited

U.S. PATENT DOCUMENTS 7,983,079 B2 * 7/2011 Kim .......................... 365/185.03
8,539,138 B2 * 9/2013 Kim et al. ..................... 711/103

FOREIGN PATENT DOCUMENTS

| JP | 2007004861 | 1/2007 |
| KR | 1020060104395 | 10/2006 |
| KR | 100965076 | 6/2010 |

* cited by examiner

*Primary Examiner* — Michael Tran
(74) *Attorney, Agent, or Firm* — Volentine & Whitt, PLLC

(57) ABSTRACT

A nonvolatile memory device is programmed by performing a plurality of program loops each comprising applying a program voltage to a selected wordline to change a threshold voltage of a selected memory cell, and applying a verification voltage to the selected wordline to verify a program state of the selected memory cell. In each program loop, the nonvolatile memory device determines a program condition and increments the program voltage by an amount determined according to the program condition.

17 Claims, 15 Drawing Sheets

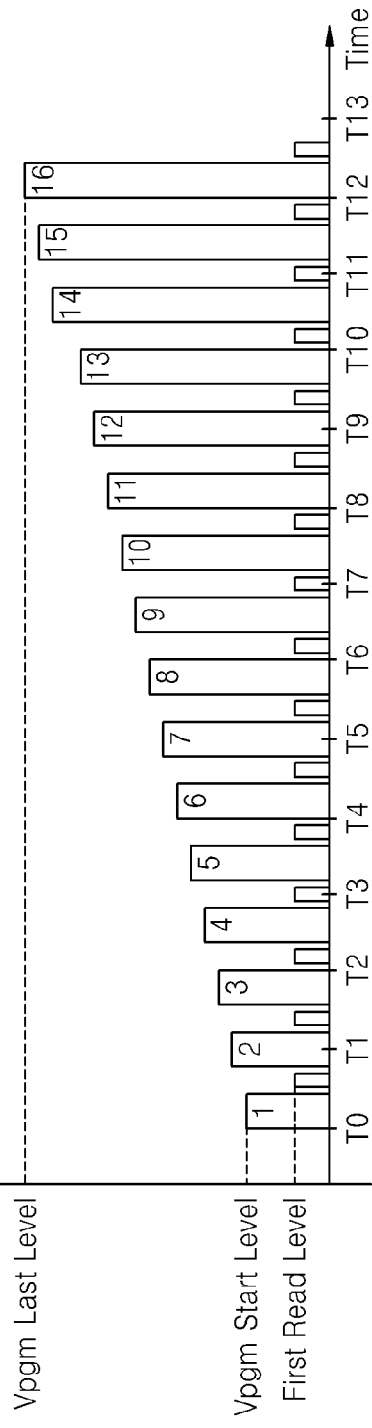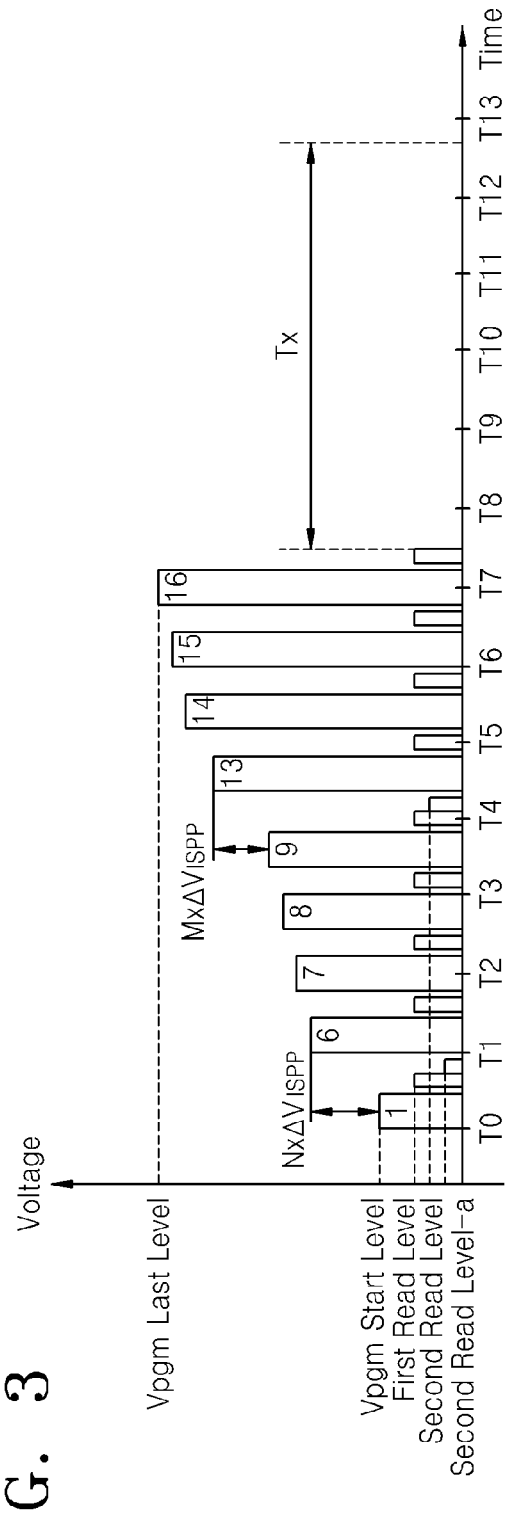

NONVOLATILE MEMORY DEVICE AND RELATED PROGRAMMING METHOD

CROSS-REFERENCE TO RELATED APPLICATIONS

This application claims priority under 35 U.S.C. §119 to Korean Patent Application No. 10-2011-0077371 filed on Aug. 3, 2011, the disclosure of which is hereby incorporated by reference in its entirety.

BACKGROUND OF THE INVENTION

The inventive concept relates generally to electronic memory technologies. More particularly, the inventive concept relates to a memory device and a related programming method.

Nonvolatile memory devices preserve stored information even when disconnected from power. Accordingly, they are commonly used to provide long term data storage in devices that may be powered down occasionally.

Flash memory is a form of nonvolatile memory that has achieved widespread popularity in recent years due to attractive features such as relatively high integration density, low power consumption, and an ability to withstand physical shock. As the demand for flash memory has grown, there has been a continual demand for flash memory having improved performance. Accordingly, researchers are continually seeking ways to improve the storage capacity, speed, reliability, and other performance characteristics of flash memory.

SUMMARY OF THE INVENTION

In one embodiment of the inventive concept, a method of programming a nonvolatile memory device comprises performing a plurality of program loops each comprising applying a program voltage to a selected wordline to change a threshold voltage of a selected memory cell, and applying a verification voltage to the selected wordline to verify a program state of the selected memory cell, and in each program loop, determining a program condition and incrementing the program voltage by an amount determined according to the program condition.

In another embodiment of the inventive concept, a nonvolatile memory device comprises a memory cell array comprising memory cells connected to word lines and bit lines, a voltage generator that generates a program voltage to be applied to a selected word line and a voltage to be applied to a selected bit line, wherein the selected word line and the selected bit line are connected to a selected memory cell to be programmed, and a control logic unit that determines a magnitude of the program voltage by selecting one of a plurality of increments of the program voltage according to a number of program loops that have been performed in a current program operation.

In yet another embodiment of the inventive concept, a method of programming a nonvolatile memory device using incremental step pulse programming (ISPP) comprises determining whether a next program loop of the ISPP satisfies a program condition, upon determining that the next program loop satisfies the program condition, performing the next program loop with an ISPP hopping method and a bit line forcing method, and upon determining that the next program loop does not satisfy the program condition, performing the next program loop with a normal ISPP method.

These and other embodiments of the inventive concept may provide nonvolatile memory devices having improved programming speed.

BRIEF DESCRIPTION OF THE DRAWINGS

The drawings illustrate selected embodiments of the inventive concept. In the drawings, like reference numbers indicate like features.

FIG. 2 is a diagram of a program voltage and a verification voltage supplied to a selected word line when programming selected memory cells according to an embodiment of the inventive concept.

FIG. 3 is a diagram of a program voltage and a verification voltage supplied to a selected word line in a programming method according to an embodiment of the inventive concept.

DETAILED DESCRIPTION

Embodiments of the inventive concept are described below with reference to the accompanying drawings. These embodiments are presented as teaching examples and should not be construed to limit the scope of the inventive concept.

The terminology used in this description is intended to describe specific embodiments and is not intended to limit the scope of the inventive concept. Expressions in the singular form encompass the plural form as well unless otherwise indicated by context or express description. Terms such as "comprise", "include", and "have" indicate the presence of stated features, but they do not preclude the presence of additional features.

All terms used herein, including technical or scientific terms, have the same meaning as generally understood by those of ordinary skill in the art unless otherwise defined. Terms such as those defined in common dictionaries have meanings as understood in the context of the relevant technology are not to be interpreted in an idealized or overly formal manner unless expressly so defined.

Figure 1A:
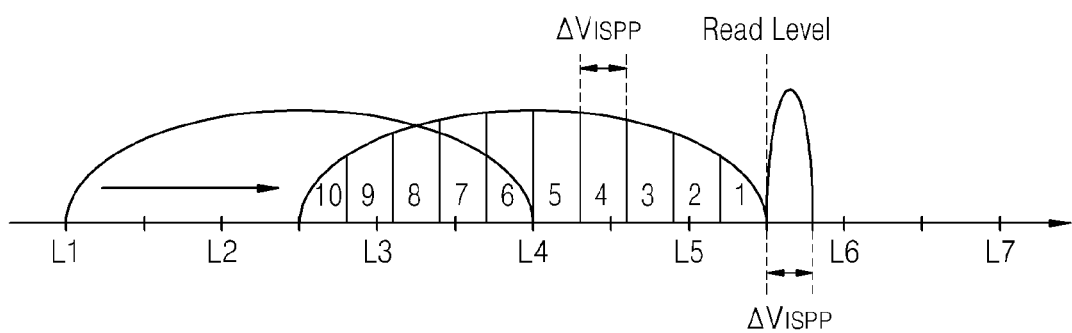
FIG. 1A is a threshold voltage distribution diagram of a one-shot memory cell according to an embodiment of the inventive concept.
Figure 1B:
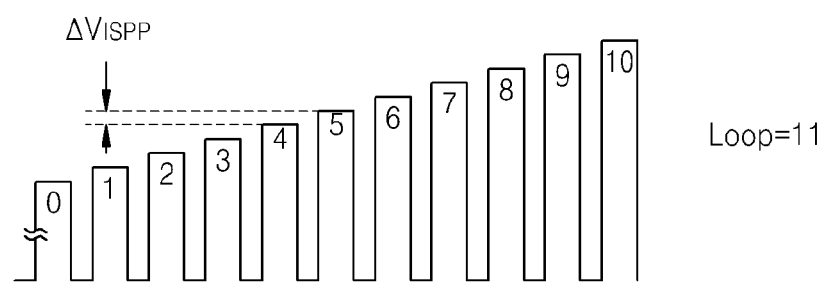
FIG. 1B is a diagram of a program voltage used in an ISPP method according to an embodiment of the inventive concept.

FIG. 1A is a threshold voltage distribution diagram of a one-shot memory cell according to an embodiment of the inventive concept. This diagram is used to describe programming speed of a nonvolatile memory device. The term "one-shot memory cell" refers to a memory cell that has been programmed with a single program pulse. For instance, in an ISPP method, a memory cell is considered to be a one-shot memory cell after receiving only a first program pulse among a sequence of program pulses. FIG. 1B is a diagram of a program voltage used in an ISPP method according to an embodiment of the inventive concept.

Referring to FIG. 1A, the one-shot memory cell has a threshold voltage distribution with regions labeled 1-10. Before programming, the one-shot memory cell has a threshold voltage distribution shown on the left side of the diagram. The one-shot memory cell has a target threshold voltage distribution shown on the right side of the diagram.

Referring to FIG. 1B, the ISPP method increases a program voltage by a unit increment $\Delta V_{ISPP}$ with each successive program loop. Thus, a total number of program loops is calculated by dividing a voltage among the target threshold voltage distribution by the increment $\Delta V_{ISPP}$. Programming speed is then determined by multiplying the total number of program loops by a program loop unit time. In the example of FIGS. 1A and 1B, the total number of program loops is 11.

FIG. 2 is a diagram of a program voltage and a verification voltage supplied to a selected word line when programming selected memory cells according to an embodiment of the inventive concept. In the description that follows, the terms "selected word line" and "selected bit line" will refer generally to a word line or bit line connected to at least one memory cell to be programmed or read. Such memory cells will be referred to as selected memory cells. Similarly, the terms "non-selected word line" and "non-selected bit line" will refer generally to a word line or bit line not connected to at least one memory cell to be programmed or read.

Referring to FIG. 2, "First Read Level" indicates a level of the verification voltage for determining a program state of the selected memory cells. For example, First Read Level may represent a voltage value for verifying a single program state in a single level cell (SLC), or it may represent a voltage value for verifying a program state among a plurality of program states in a multi level cell (MLC).

FIG. 3 is a diagram of program and verification voltages supplied to a selected word line in a programming method according to an embodiment of the inventive concept. In the embodiment of FIG. 3, programming is completed with fewer program loops compared with the embodiment of FIG. 2. Accordingly, programming speed is improved relative to the embodiment of FIG. 2.

In the embodiment of FIG. 3, additional verification voltages having levels labeled "Second Read Level–a" and "Second Read Level" are used to determine whether selected memory cells have reached intermediate threshold voltages. Based on these determinations, certain program loops can be omitted. For example, as illustrated in FIG. 3, program loops 2-5 and 10-12 are omitted based on a selected memory cell reaching the levels labeled "Second Read Level–a" and "Second Read Level". This allows a reduction Tx in programming time. Various mechanisms for accomplishing the reduction of programming time as illustrated in FIG. 3 will become apparent from the description below.

Figure 4:
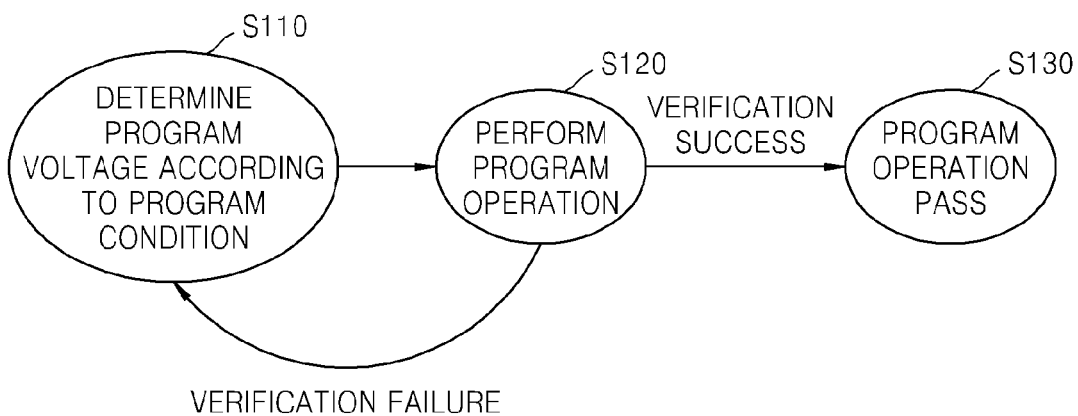
FIG. 4 is a flowchart illustrating a programming method of a nonvolatile memory device according to an embodiment of the inventive concept.

FIG. 4 is a flowchart illustrating a programming method of a nonvolatile memory device according to an embodiment of the inventive concept. In the method of FIG. 4, a program voltage is determined according to a program condition.

Referring to FIG. 4, in operation S110, the nonvolatile memory device determines a program voltage to be applied to a selected word line according to a program condition. The program condition may include the number of program prohibition cells (or program permission cells) connected to the selected word line or a number of program loops that have been performed in a current program operation, for example.

As the number of program loops increases, the program voltage is increased by $\Delta V_{ISPP}+Vi$ instead of a constant unit increment $\Delta V_{ISPP}$ in specific program loops. In other words, the program voltage may be determined by selecting a second increment $\Delta V_{ISSP}+Vi$ for program loops of a specific category and selecting a first increment $\Delta V_{ISSP}$ for program loops not of the specific category, wherein the second increment is greater than the first increment. As an example, the second increment may be N times the first increment, where N is a positive integer. The specific program loops may be determined to include a program loop in which an off cell is initially detected or a program loop succeeding the program loop in which the off cell is initially detected. The off cell indicates a memory cell whose programming is completed.

After the program voltage is determined, the nonvolatile memory device performs the program operation in operation S120. That is, the nonvolatile memory device applies the program voltage determined in operation S110 to the selected word line and applies a pass voltage lower than the program voltage and capable of turning memory cells on to non-selected word lines. In addition, the nonvolatile memory device applies a program permission voltage to a bit line connected to a memory cell to be programmed, and it applies a program prohibition voltage to bit lines connected to program prohibition cells. The bit line program permission voltage may vary according to a distribution of threshold voltages of memory cells.

Where a program verification operation succeeds as a result of the program operation (VERIFICATION SUCCESS), the program operation is completed in operation S130. However, when the program verification operation does not succeed as a result of the program operation (VERIFICATION FAILURE), the programming method returns to operation S110 to perform a next program loop. Accordingly, the program voltage may be increased in the next program loop according to the program condition.

Figure 5:
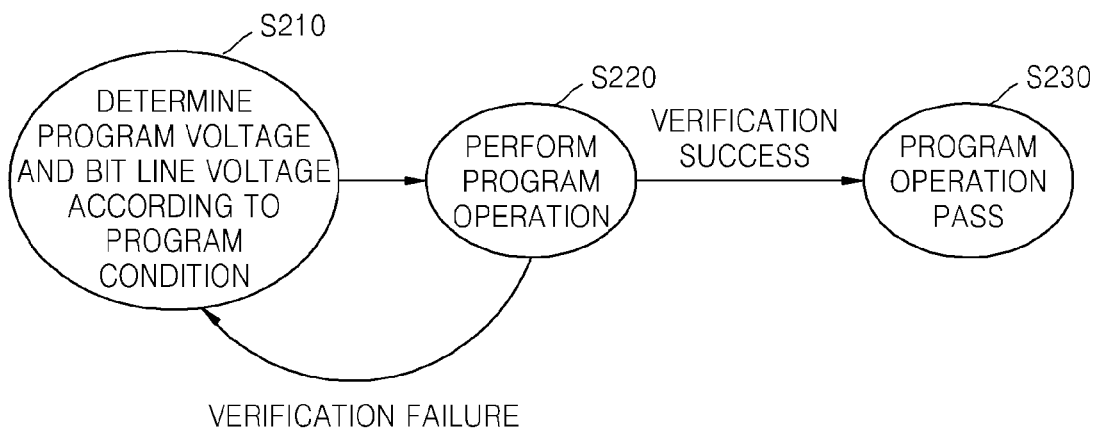
FIG. 5 is a flowchart illustrating a programming method of a nonvolatile memory device according to an embodiment of the inventive concept.

FIG. 5 is a flowchart illustrating a programming method of a nonvolatile memory according to another embodiment of the inventive concept. In the method of FIG. 5, a program voltage and a bit line voltage are controlled according to a program condition.

Referring to FIG. 5, in operation S210, the nonvolatile memory device determines a program voltage to be applied to a selected word line and a voltage to be applied to a selected bit line according to a program condition. The program condition may include the number of program prohibition cells (or program permission cells) connected to the selected word line or a number of program loops that have been performed, for example.

As the number of program loops increases, the program voltage is increased by $\Delta V_{ISPP}$+Vi instead of the same increment $\Delta V_{ISPP}$ in specific program loops. Here, Vi denotes a positive voltage value and may vary according to the different specific program loops.

The program voltage can be determined by selecting the second increment $\Delta V_{ISSP}$+Vi for program loops of a specific category and selecting the first increment $\Delta V_{ISPP}$ for program loops not of the specific category, wherein the second increment is greater than the first increment. For example, the second increment can be N times the first increment. In addition, the specific program loops may be determined to include a program loop in which an off cell is initially detected or a program loop immediately following the program loop in which the off cell is initially detected.

The voltage to be applied to the selected bit line can be variously determined according to programming conditions and a distribution of threshold voltages of memory cells. For example, in a program loop using the second increment, a voltage applied to a bit line of a memory cell having a threshold voltage between a first voltage and a second voltage may be a third voltage, and a voltage applied to a bit line of a memory cell having a threshold voltage less than the second voltage may be a fourth voltage. The first voltage may be a verification voltage for determining a program state, the second voltage may be a lower voltage value than the first voltage, and the third voltage may be a higher voltage value than the fourth voltage. For example, the fourth voltage may be 0 V. In addition, the first voltage may be a voltage for verifying a single program state in an SLC or a voltage for verifying one target program state from among a plurality of program states in an MLC.

The second increment of the program voltage may be N times the first increment. A difference between the first voltage and the second voltage and a difference between the third voltage and the fourth voltage may be (N−1) times the first increment. Here, N may be variously determined according to specific program loops.

In a program loop continued after completing the program loop with the second increment, the program condition may be determined so that (N−2) program loops are performed with the first increment.

After the program voltage and the bit line voltage are determined, the nonvolatile memory device performs the program operation in operation S220. That is, the nonvolatile memory device applies the program voltage determined in operation S210 to the selected word line and applies a pass voltage lower than the program voltage and capable of turning memory cells on to non-selected word lines. In addition, the nonvolatile memory device applies the bit line voltage determined in operation S210 to the selected bit line and applies a bit line program prohibition voltage to non-selected bit lines to which program prohibition cells are connected.

Where a program verification operation succeeds as a result of the program operation (VERIFICATION SUCCESS), the program operation is completed in operation S330. However, where the program verification operation does not succeed as a result of the program operation (VERIFICATION FAILURE), the programming method returns operation S210 to perform a next program loop. The program voltage in the next program loop is increased relative to the current program loop according to the program condition. In addition, the voltage to be applied to a bit line may be determined according to the program condition.

Figure 6:
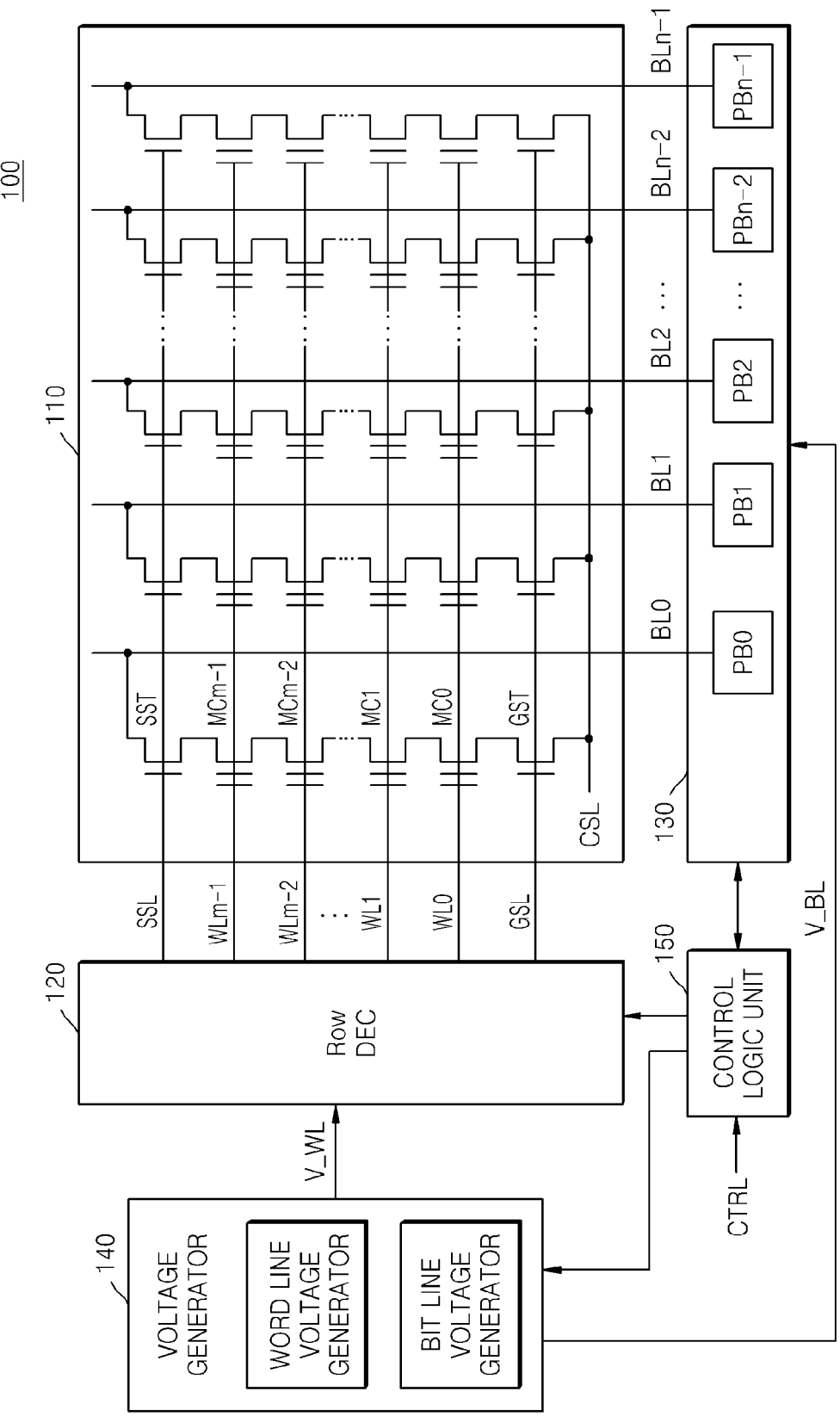
FIG. 6 is a block diagram of a nonvolatile memory device according to an embodiment of the inventive concept.

FIG. 6 is a block diagram of a nonvolatile memory device 100 according to an embodiment of the inventive concept.

Referring to FIG. 6, nonvolatile memory device 100 comprises a memory cell array 110, a row decoder 120, a read/write circuit 130, a voltage generator 140, and a control logic unit 150.

Memory cell array 110 comprises memory cells connected to respective combinations of word lines WL0 to WLm−1 and bit lines BL0 to BLn−1, wherein m and n are natural numbers. Memory cell array 110 comprises a plurality of memory blocks, and a single memory block is shown in FIG. 6. Each memory block comprises a plurality of pages each comprising a plurality of memory cells connected to a corresponding word line. Nonvolatile memory device 100 performs an erase operation on a block basis and performs a program operation or a read operation on a page basis.

Memory cell array 110 has a cell string structure. Each cell string comprises a string selection transistor (SST), a plurality of memory cells MC0 to MCm−1 respectively connected to the plurality of word lines WL0 to WLm−1, and a ground selection transistor (GST) connected to a ground selection line (GSL). The SST is connected between a bit line and a string channel, and the GST is connected between the string channel and a common source line (CSL).

Figure 7:
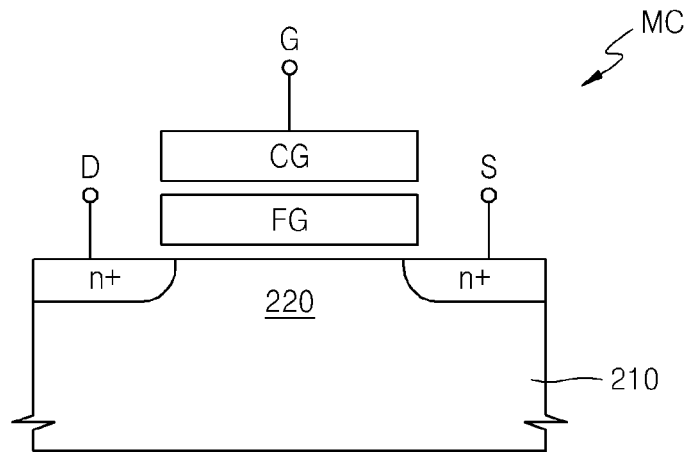
FIG. 7 is a cross-sectional diagram of a memory cell shown in FIG. 6.

FIG. 7 is a cross-sectional diagram of a memory cell MC, which may be any one of memory cells MC0-MCm−1 shown in FIG. 6. Referring to FIG. 7, a source S and a drain D are formed on a semiconductor substrate 210 with a channel region 220 between them. A floating gate FG is formed on channel region 220 by disposing a thin insulation film between floating gate FG and channel region 220. A control gate CG is formed on floating gate FG by disposing an insulation film between control gate CG and floating gate FG. Voltages required for the program operation, the erase operation, and the read operation are applied to source S, drain D, floating gate FG, control gate CG, and semiconductor substrate 210 through a word line or a bit line.

Memory cell MC can store one-bit data or two-or-more bit data. In other words, it can comprise an SLC or an MLC. An SLC has an erase state or a program state according to its threshold voltage. An MLC has any one of the erase state and a plurality of program states according to its threshold voltage.

The memory cells shown in FIG. 6 may be implemented by SLCs or MLCs. For example, where memory cell MC1 is programmed, a program voltage Vpgm is applied to its control gate CG, and a ground voltage Vss or a voltage of a specific level is applied to bit line BL0. Due to a voltage difference between the channel of memory cell MC1 and the floating gate FG of memory cell MC1, electrons emitted from a channel region below floating gate FG are injected into floating gate FG. If the electrons accumulate in floating gate FG, it assumes a negative charge state, which increases a threshold voltage of memory cell MC1. The program voltage Vpgm is applied to the word line WL1 so that the program voltage Vpgm is applied to control gate CG of memory cell MC1.

Row decoder 120 is connected to memory cell array 110 through the SSL, the GSL, and word lines WL0 to WLm−1. Row decoder 120 receives an address in the program operation or the read operation and selects a word line according to the received address. The selected word line is connected to memory cells to be programmed in the program operation or read in the read operation.

Row decoder 120 applies voltages (e.g., a program voltage, a pass voltage, a read voltage, a string selection voltage, and a ground selection voltage) required for the program operation or the read operation to the selected word line, non-selected word lines, the SSL, and the GSL. The voltages required for the program operation and the read operation are generated by voltage generator 140.

Read/write circuit 130 is connected to memory cell array 110 via bit lines BL0 to BLn−1. Read/write circuit 130 comprises a plurality of page buffers PB0 to PBn−1. Page buffers PB0 to PBn−1 temporarily store data to be programmed in or data to be read from memory cells connected to a selected word line.

In the program operation, a bit line program permission voltage is applied to bit lines connected to program permission cells, and a bit line program prohibition voltage is applied to bit lines connected to program prohibition cells. The bit line program permission voltage and the bit line program prohibition voltage are generated by voltage generator 140.

Voltage generator 140 generates various voltages required for the program operation, the read operation, and the erase operation. That is, voltage generator 140 generates voltages required for a word line or a bit line in the program operation, the read operation, and the erase operation. For example, voltage generator 140 generates a program voltage Vpgm, a pass voltage, a read voltage, and voltages applied to bit lines. Voltage generator 140 changes a level of the program voltage Vpgm to be applied to a selected word line or a voltage V_BL to be applied to a selected bit line according to a program condition in the program operation.

In the example of FIG. 6, word line voltages supplied from voltage generator 140 to row decoder 120 are labeled V_WL. For example, V_WL may comprise the program voltage Vpgm. Similarly, bit line voltages supplied from voltage generator 140 to read/write circuit 130 are labeled V_BL.

Control logic unit 150 is connected to row decoder 120, read/write circuit 130, and voltage generator 140. Control logic unit 150 receives control signals CTRL and controls a general operation of nonvolatile memory device 100. Control logic unit 150 controls voltage generator 140 to generate the program voltage Vpgm and bit line voltage V_BL as described below.

As the number of program loops increases, the program voltage is increased by $\Delta V_{ISPP}$+Vi instead of the same constant unit increment $\Delta V_{ISPP}$ in specific program loops. Here, Vi denotes a positive voltage value and may vary according to different specific program loops. For example, the program voltage may be determined by selecting the second increment $\Delta V_{ISPP}$+Vi for program loops of a specific category and selecting the first increment $\Delta V_{ISPP}$ for program loops not of the specific category, wherein the second increment is greater than the first increment. Here, the second increment may be N times the first increment.

In a program loop using the second increment, the bit line program permission voltage is generated so that the third voltage is applied to a bit line of a memory cell having a threshold voltage between the first voltage and the second voltage and the fourth voltage is applied to a bit line of a memory cell having a threshold voltage less than the second voltage. The first voltage may be a program verification voltage, the second voltage may be a voltage lower than the first voltage, and the third voltage may be a voltage higher than the fourth voltage. The program verification voltage is a voltage for verifying whether a memory cell to be programmed has a threshold voltage corresponding to a target program state. For example, the program verification voltage may be a voltage for verifying a single program state in an SLC or a voltage for verifying one target program state from among a plurality of program states in an MLC.

Figure 12:
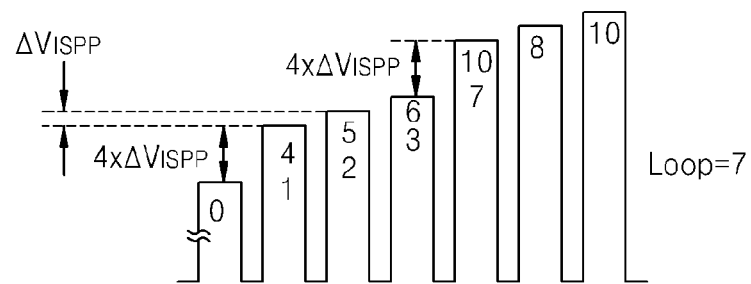
FIG. 12 is a diagram of a program voltage generated in a programming method according to an embodiment of the inventive concept.
Figure 15:
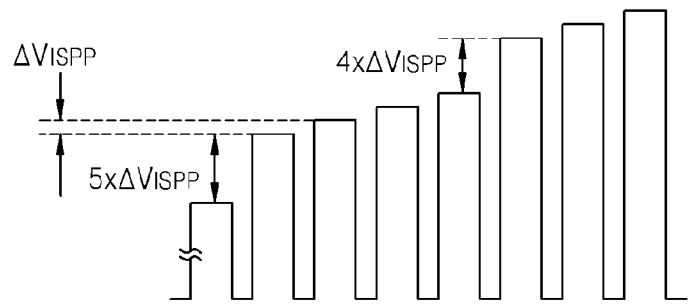
FIG. 15 is a diagram of a program voltage generated in a programming method according to another embodiment of the inventive concept.

The second increment of the program voltage may be N times the first increment. A difference between the first voltage and the second voltage and a difference between the third voltage and the fourth voltage may be (N−1) times the first increment. Here, N may vary between different specific program loops. For instance, FIG. 12 shows an example where the program voltage is increased by 4×$\Delta V_{ISPP}$ in second and fifth program loops and by $\Delta V_{ISPP}$ in the other program loops. FIG. 15 shows an example where the program voltage is increased by 5×$\Delta V_{ISPP}$ in a second program loop, by 4×$\Delta V_{ISPP}$ in a sixth program loop, and by $\Delta V_{ISPP}$ in the other program loops.

Figure 8:
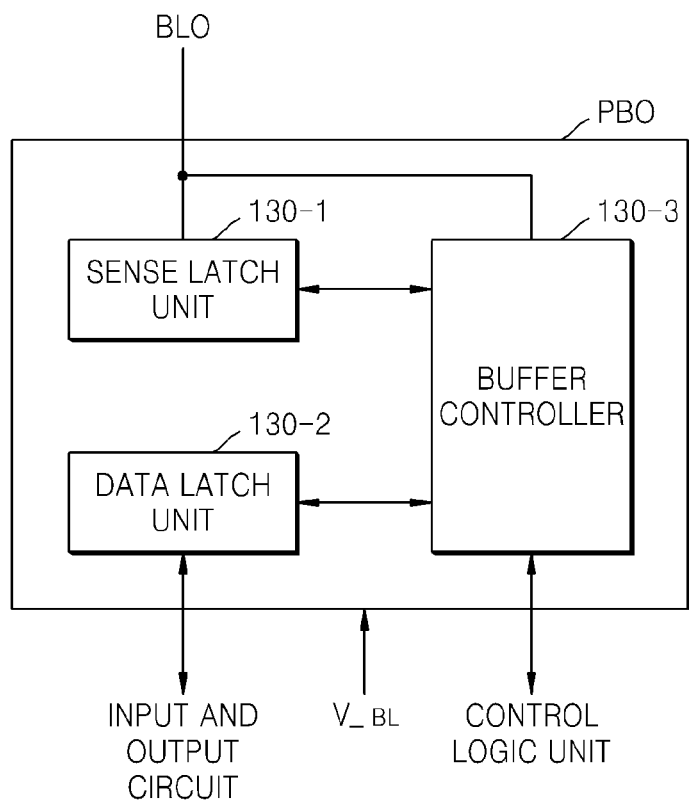
FIG. 8 is a block diagram of a page buffer shown in FIG. 6 according to an embodiment of the inventive concept.

FIG. 8 is a block diagram of page buffer PB0 of FIG. 6 according to an embodiment of the inventive concept.

Referring to FIG. 8, page buffer PB0 comprises a sense latch unit 130-1, a data latch unit 130-2, and a page buffer controller 130-3.

Sense latch unit 130-1 is connected to bit line BL0. In a read operation, sense latch unit 130-1 stores data of a memory cell connected to bit line BL0 by sensing a voltage level of bit line BL0. In a program operation, sense latch unit 130-1 stores data corresponding to bit line BL0 from among data stored in data latch unit 130-2.

Data latch unit 130-2 stores data input in the program operation or stores data transmitted from sense latch unit 130-1.

Page buffer controller 130-3 controls a voltage supplied to bit line BL0 according to the data stored in data latch unit 130-2 in the program operation. For example, where the data stored in data latch unit 130-2 corresponds to the erase state (e.g., '1'), page buffer controller 130-3 applies the bit line program prohibition voltage to bit line BL0. Where the data stored in data latch unit 130-2 corresponds to the program state (e.g., '0'), page buffer controller 130-3 applies the bit line program permission voltage to bit line BL0.

Page buffer controller 130-3 determines a voltage to be supplied to bit line BL0 in a next program loop according to a state of data stored in sense latch unit 130-1 in the program verification operation. This voltage is generated from bit line voltage V_BL generated by voltage generator 140. For example, where the data stored in sense latch unit 130-1 corresponds to the program state, page buffer controller 130-3 applies to the bit line program prohibition voltage to bit line BL0 in the next program loop. Where the data stored in sense latch unit 130-1 corresponds to the erase state, page buffer controller 130-3 applies to the bit line program permission voltage to bit line BL0 in the next program loop. The bit line program permission voltage may be differently set according to a program condition and a threshold voltage distribution of memory cells.

As described above, a magnitude of the program voltage is determined by applying the second increment $\Delta V_{ISPP}$+Vi for program loops of a specific category and applying the first increment $\Delta V_{ISPP}$ for program loops not of the specific category, where the second increment is greater than the first increment. Thus memory cells having a threshold voltage between the first voltage and the second voltage and memory cells having a threshold voltage less than the second voltage are classified among memory cells to be programmed using a 2-step verification process. In the 2-step verification process, the first voltage and the second voltage are applied as the read voltage in different steps of a program loop immediately before a program loop of the specific category.

The first voltage is a verification voltage for determining a program state of a memory cell, and the second voltage is lower than the first voltage. The second increment is N times the first increment $\Delta V_{ISPP}$, and the difference between the first voltage and the second voltage is (N−1) times the first increment $\Delta V_{ISPP}$.

The third voltage is a bit line program prohibition voltage. It is applied to a bit line of selected memory cells having a threshold voltage between the first voltage and the second voltage. The fourth voltage is a bit line program permission voltage. It is applied to a bit line of selected memory cells having a threshold voltage less than the second voltage. The third voltage is higher than the fourth voltage. A difference between the third voltage and the fourth voltage may be (N−1) times the first increment $\Delta V_{ISPP}$. For example, the fourth voltage may be 0 V, and the third voltage may be (N−1)× $\Delta V_{ISPP}$.

Figure 9:
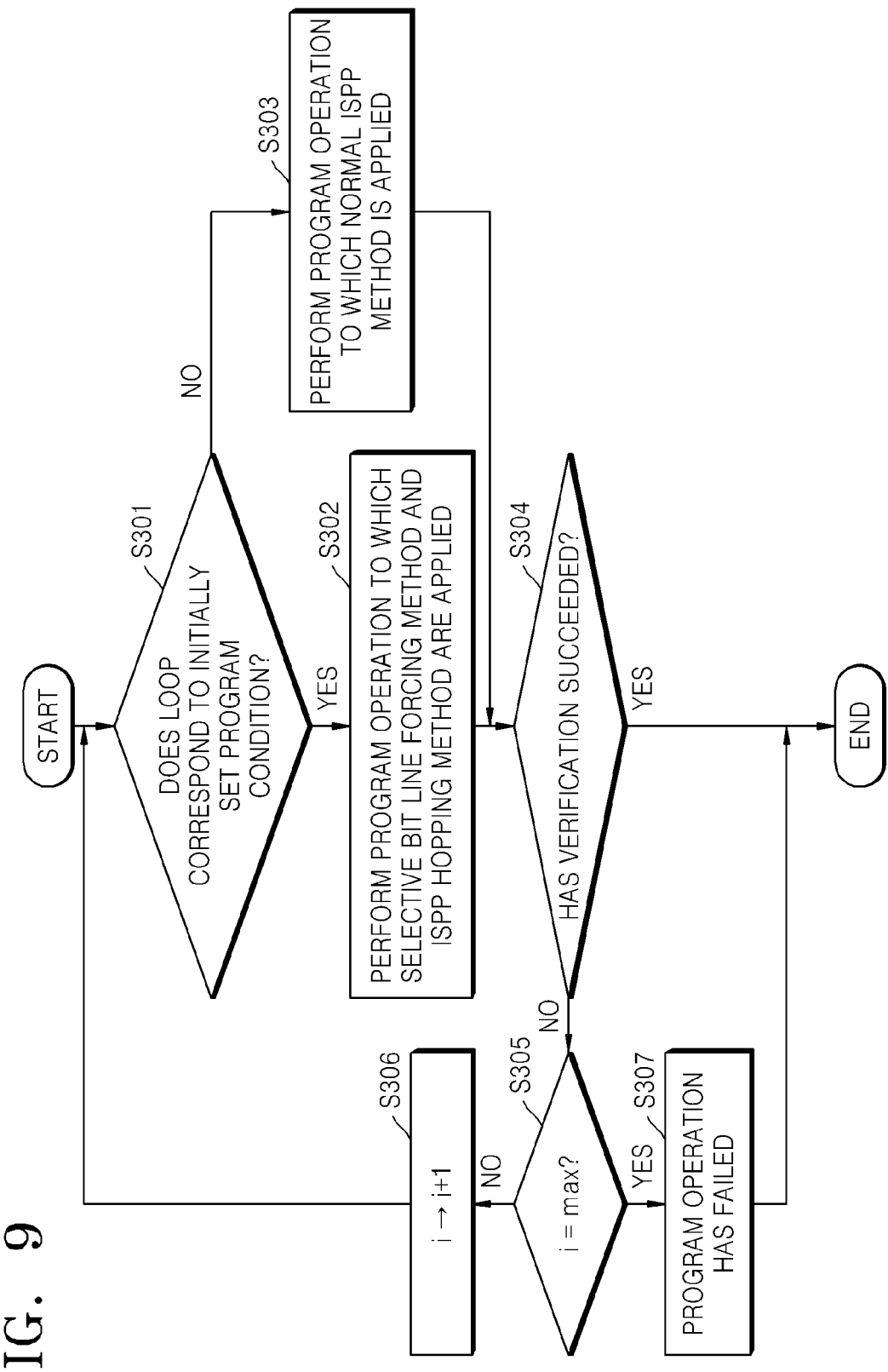
FIG. 9 is a flowchart illustrating a programming method of a nonvolatile memory device according to an embodiment of the inventive concept.

FIG. 9 is a flowchart illustrating a programming method of a nonvolatile memory device according to an embodiment of the inventive concept.

Referring to FIG. 9, after a program operation starts, it is determined in operation S301 whether a next program loop corresponds to an initially set program condition. The initially set program condition may include, for instance, a number of program loops having been performed in the program operation, a number of program prohibition cells (or program permission cells) connected to a selected word line, or a distribution of threshold voltages of memory cells.

As a result of the determination of operation S301, if the program loop to be performed next corresponds to, or satisfies, the initially set program condition (S301=Yes), a program operation to which a selective bit line forcing method and an ISSP hopping method are applied is performed in operation S302.

The ISSP hopping method generates a program voltage using an increment greater than the unit increment $\Delta V_{ISPP}$ in specific program loops according to the number of program loops that have been performed with the unit increment $\Delta V_{ISPP}$, i.e., using a normal ISPP method. The incremented program voltage is applied in specific program loops corresponding to the initially set program condition. For example, in the specific program loops, the program voltage may be increased by an increment N×$\Delta V_{ISPP}$, and in program loops other than the specific program loops, the program voltage may be increased by an increment $\Delta V_{ISPP}$, which is the unit increment of the normal ISSP method. Of course, an increment of the program voltage may be set differently according to the specific program loops.

The selective bit line forcing method applies a voltage for adjusting a program speed to a bit line of a memory cell having a threshold voltage between the first voltage and the second voltage. This voltage is adjusted when the program voltage of the ISSP hopping is generated and applied to the selected word line in a specific program loop corresponding to the initially set program condition. For example, in the specific program loop corresponding to the initially set program condition, a forcing voltage (N−1)×$\Delta V_{ISPP}$ may be applied to a bit line of a memory cell having a threshold voltage between the first voltage and the second voltage, and 0 V may be applied to a bit line of a memory cell having a threshold voltage less than the second voltage.

As a result of the determination of operation S301, if the program loop to be performed next does not correspond to the initially set program condition (S301=No), a program operation is performed with the normal ISSP method in operation S303. That is, every time the number of program loops increases, the program voltage is increased by the constant unit increment $\Delta V_{ISPP}$ and then applied to the selected word line. Thereafter, the same bit line program permission voltage is applied to bit lines connected to selected memory cells.

In operation S304, it is determined whether a program verification operation has succeeded as a result of operation S302 or S303. That is, it is determined whether all of the memory cells to be programmed that are connected to the selected word line have been normally programmed. In other words, where data read from at least one memory cell to be programmed is different from data on a corresponding bit line that is stored in data latch unit 130-3 of read/write circuit 130, it is determined that the program verification operation has failed.

As a result of the determination of operation S304, if the program verification operation has succeeded (S304=Yes), the program operation ends. Otherwise, if the program verification operation has failed (S304=No), it is determined in operation S305 whether the number "i" of program loops performed until now corresponds to a maximum value.

As a result of the determination of operation S305, if the number i of program loops does not correspond to the maximum value (S305=No), the number i of program loops is increased by 1 in operation S306, and the programming method returns to operation S301. Otherwise, if the number i of program loops corresponds to the maximum value (S305=Yes), it is determined in operation S307 that the program operation has failed, and the program operation ends.

Figure 10:
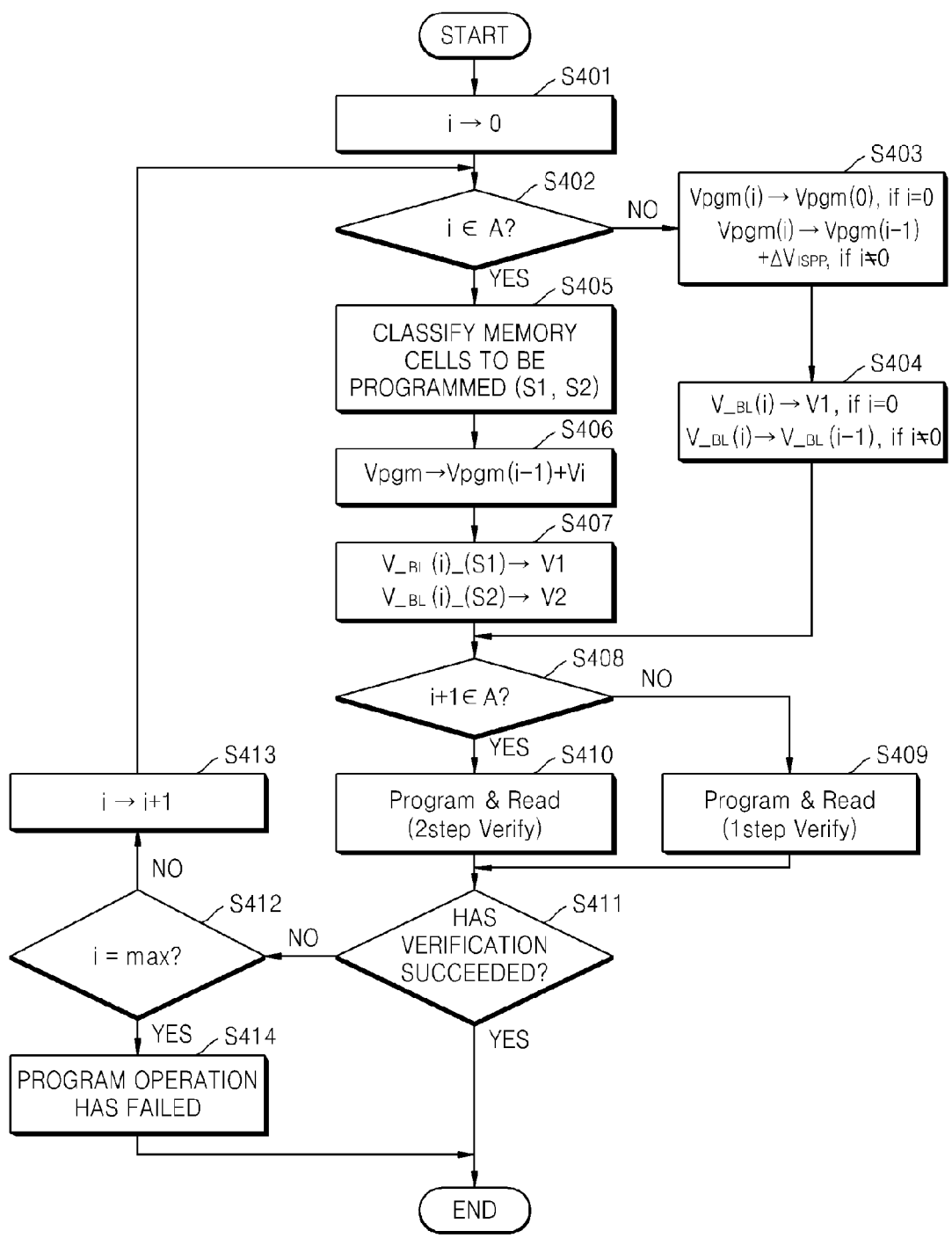
FIG. 10 is a flowchart illustrating a programming method of a nonvolatile memory device according to an embodiment of the inventive concept.

FIG. 10 is a flowchart illustrating a programming method of a nonvolatile memory device according to another embodiment of the inventive concept.

Referring to FIG. 10, where a program command is received by the nonvolatile memory device, a value of a counter (not shown) for counting the number i of program loops is reset to 0 in operation S401. For example, the counter for counting the number i of program loops may be incorporated in control logic unit 150 of FIG. 4.

In operation S402, it is determined whether program loop i is among a set A of initially set specific program loops. Set A indicates a set of program loops for which a program voltage is generated using the ISSP hopping method. Set A can be defined with default values during design of the nonvolatile memory device.

As a result of the determination of operation S402, if program loop i is not among the set A (S402=No), a program voltage for i=0 is a program start voltage Vpgm(0), and a program voltage Vpgm(i) for i≠0 is a value obtained by adding the unit increment $\Delta V_{ISPP}$ to a program voltage Vpgm(i−1) applied in a previous program loop in operation S403.

In operation S404, a voltage V_BL(i) to be supplied to a bit line connected to a memory cell to be programmed for i=0 is a voltage V1 of a first level, and voltage V_BL(i) to be supplied to a bit line connected to a memory cell to be programmed for i≠0 is a voltage V_BL(i−1) supplied to the bit line in the previous program loop. For example, voltage V1 may be 0 V. Of course, a voltage applied to bit lines connected to memory cells that are not supposed to be programmed or have been completely programmed from among memory cells connected to a selected word line is the program prohibition voltage.

As a result of the determination of operation S402, if program loop i is among the set A (S402=Yes), memory cells to be programmed through a selected word line are classified in operation S405. For example, memory cells having a threshold voltage between a verification voltage (First Read Level) and Second Read Level (=First Read Level−(N−1)×$\Delta V_{ISPP}$) are classified as a second group S2, and memory cells having a threshold voltage less than Second Read Level are classified as a first group S1. N represents a value obtained by dividing an increment of a program voltage in a specific program loop corresponding to an element of set A by the unit increment of the program voltage according to the general ISSP method.

In operation S406, program voltage Vpgm(i) to be applied in the number i of program loops is determined. For example, program voltage Vpgm(i) to be applied in the number i of program loops may be a value obtained by adding a voltage Vi to program voltage Vpgm(i−1) applied in the previous program loop. Voltage Vi may be a voltage value greater than the program voltage unit increment $\Delta V_{ISPP}$. For example, voltage Vi may be N×$\Delta V_{ISPP}$. N may be determined differently according to the elements of set A.

In operation S407, voltage V_BL(i) to be supplied to bit lines in the number i of program loops is differently determined according to the groups of the memory cells classified in operation S405. For example, a voltage V_BL(i)_(S1) to be supplied to bit lines connected to the memory cells classified as the first group S1 is voltage V1 of the first level, and a voltage V_BL(i)_(S2) to be supplied to bit lines connected to the memory cells classified as the second group S2 is a voltage V2 of a second level. For example, voltage V1 of the first level may be 0 V, and voltage V2 of the second level may be a higher level than voltage V1. For example, when Vi=N×$\Delta V_{ISPP}$, a voltage (V2−V1) may be (N−1)×$\Delta V_{ISPP}$. That is, V1 may be 0 V, and V2 may be (N−1)×$\Delta V_{ISPP}$.

After determining the program voltage Vpgm(i) to be applied to a selected word line in program loop i and a voltage to be applied to bit lines, it is determined in operation S408 whether the number (i+1) of program loops is an element of set A of initially set specific program loops.

As a result of the determination of operation S408, if program loop (i+1) is not among set A (S408=No), the determined program voltage and the determined bit line voltage are applied to a corresponding word line and a corresponding bit line to perform programming, respectively, and a 1-step verification operation is performed in operation S409. Because program loop (i+1) uses the normal ISPP method, the 1-step verification operation is performed using First Read Level. First Read Level denotes a voltage value for verifying whether a memory cell is programmed to have a target threshold voltage. That is, First Read Level may be a voltage value for verifying a single program state in an SLC and a voltage value for verifying one target program state among a plurality of program states in an MLC.

As a result of the determination of operation S408, if program loop (i+1) is among set A (S408=Yes), the determined program voltage and the determined bit line voltage are applied to a corresponding word line and a corresponding bit line to perform programming, respectively, and a 2-step verification operation is performed in operation S410. That is, to verify a program result after programming, the 2-step verification operation is performed using First Read Level and Second Read Level. Because program loop (i+1) uses the ISPP hopping method, the 2-step verification operation is performed in program loop i to classify the memory cells in operation S405. For example, as described above, First Read Level may be the verification voltage for verifying a program state, and Second Read Level may be determined according to an equation [First Read Level−(N−1)×$\Delta V_{ISPP}$]. In this equation, N denotes a value obtained by dividing an increment of a program voltage increasing in an (i+1)th specific program loop corresponding to an element of set A by the unit increment of the program voltage according to the general ISSP method.

In operation S411, it is determined whether verification has succeeded as a program verification result of operation S409 or S410. That is, where threshold voltages of all memory cells to be programmed that are connected to the selected word line have a level greater than the verification voltage, it is determined that verification has succeeded. In other words, even one of the memory cells to be programmed that are connected to the selected word line has a threshold voltage less than the verification voltage, it is determined that verification has failed.

As a result of the determination of operation S411, if verification has succeeded (S411=Yes), the program operation ends. Otherwise, if verification has failed (S411=No), it is determined in operation S412 whether the number i of program loops corresponds to a maximum value.

As a result of the determination of operation S412, if the number i of program loops does not correspond to the maximum value (S412=No), the number i of program loops is increased by 1 in operation S413, and the program operation returns to operation S402. Otherwise, if the number i of program loops corresponds to the maximum value (S412=Yes), it is determined in operation S414 that the program operation has failed, and the program operation ends.

In the programming method of FIG. 10, a program voltage and a verification voltage applied to a selected word line have values shown in FIG. 3. More specifically, in FIG. 3, a program start voltage Vpgm Start Level is applied in an initial program loop, a program voltage in a specific program loop to which the ISPP hopping method is applied is increased by N×$\Delta V_{ISPP}$ or M×$\Delta V_{ISPP}$ based on a program voltage applied in a previous program loop, and program voltages in other program loops are increased by the unit increment $\Delta V_{ISPP}$ based on a program voltage applied in a previous program loop. Each of M and N may be an integer equal to or greater than 2. M may be equal to N. For example, a voltage a may be determined according to an equation [First Read Level−(N−1)×$\Delta V_{ISPP}$]. As illustrated in FIG. 3 the 2-step verification process is performed in a program loop immediately before a specific program loop to which the ISPP hopping method is applied, and the 1-step verification process is performed in the other program loops.

Figure 11:
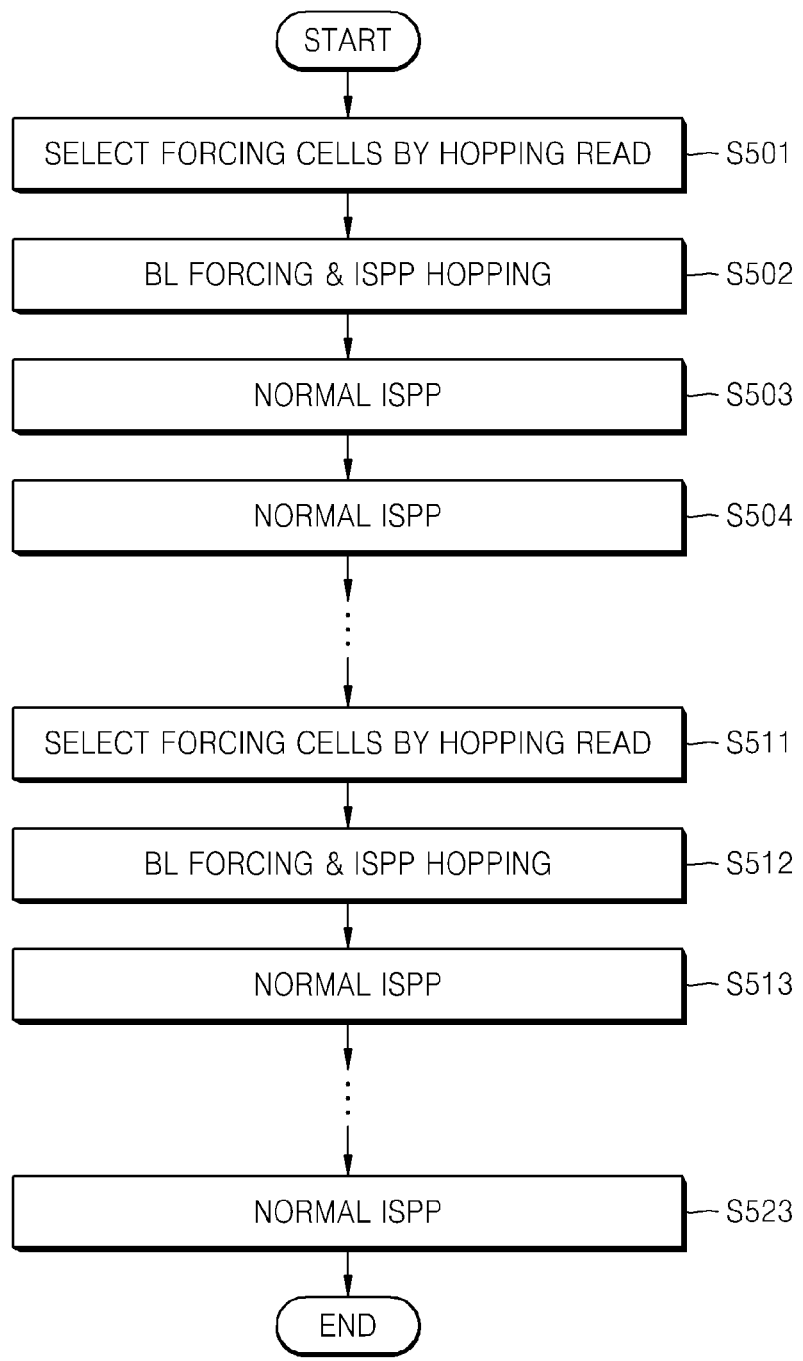
FIG. 11 is a flowchart illustrating an order of a hopping read process, an ISSP hopping process, and a normal ISSP process in program loops of a programming method according to an embodiment of the inventive concept.

FIG. 11 is a flowchart illustrating an order of a hopping read process, an ISSP hopping process, and a normal ISSP process in program loops of a programming method according to an embodiment of the inventive concept.

Referring to FIG. 11, after performing a process (operation S501 or S511) of selecting memory cells for which bit line forcing is performed by a hopping read operation, a bit line forcing and ISPP hopping process (operation S502 or S512) is performed.

In operation S501 or S511, memory cells for which bit line forcing is performed by a hopping read operation are selected according to the 2-step verification operation in a previous program loop before the bit line forcing and ISPP hopping process (operation S502 or S512) is performed. In other words, memory cells having a threshold voltage between the verification voltage (First Read Level) for determining a program state and Second Read Level (=First Read Level−(N−1)×$\Delta V_{ISPP}$) are selected as the memory cells for which bit line forcing is performed from among memory cells to be programmed through a selected word line. Here, N denotes a value obtained by dividing an increment of a program voltage used in an ISPP hopping process, by a default increment of a program voltage.

In operation S502 or S512, a forcing voltage is applied to a bit line connected to a memory cell selected as a forcing cell, and a hopping voltage is applied to a selected word line. For example, a forcing voltage V2 is applied to bit lines connected to memory cells selected as forcing cells, and a voltage V1 lower than the forcing voltage V2 is applied to bit lines connected to the other memory cells to be programmed. The program prohibition voltage is applied to bit lines connected to memory cells that are not supposed to be programmed or have been completely programmed from among memory cells connected to the selected word line. A program voltage increased by N×$\Delta V_{ISPP}$ or M×$\Delta V_{ISPP}$ based on a program voltage applied in a previous program loop is applied to the word line selected to be programmed.

After performing the bit line forcing and ISPP hopping process (operation S502 or S512) in a specific program loop, a program loop to which a normal ISPP process (operation S503, S504, S513, or S514) is applied is performed multiple times.

In the normal ISPP process (operation S503, S504, S513, or S514), every time the number of program loops increases, a program voltage is increased by the unit increment $\Delta V_{ISPP}$, and the forcing voltage V2 is not selectively applied to bit lines. For example, in the normal ISPP process (operation S503, S504, S513, or S514), 0 V is applied to bit lines connected to memory cells to be programmed from among the memory cells connected to the selected word line, and the program prohibition voltage is applied to the bit lines connected to the memory cells that are not to be programmed or have been completely programmed from among the memory cells connected to the selected word line.

FIG. 12 is a diagram of a program voltage generated in a programming method according to an embodiment of the inventive concept.

Referring to FIG. 12, the program voltage is a program start voltage in a first program loop, increased by 4×$\Delta V_{ISPP}$ based on the program voltage applied to a previous program loop in second and fifth program loops, and increased by $\Delta V_{ISPP}$ in other program loops.

Figure 13:
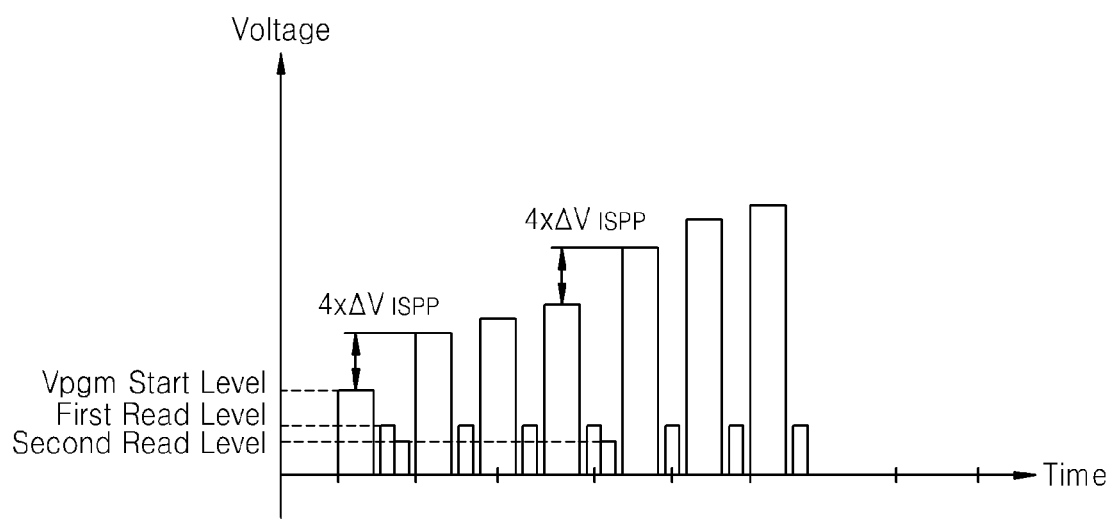
FIG. 13 is a diagram of voltages applied to a selected word line in a programming method according to an embodiment of the inventive concept.

FIG. 13 is a diagram of voltages applied to a selected word line in a programming method according to an embodiment of the inventive concept. More specifically, FIG. 13 shows both a program voltage and a verification voltage. FIGS. 14A-14G illustrate variations of a threshold voltage distribution of memory cells according to the number of program loops based on the voltage values shown in FIG. 13.

Figure 14:
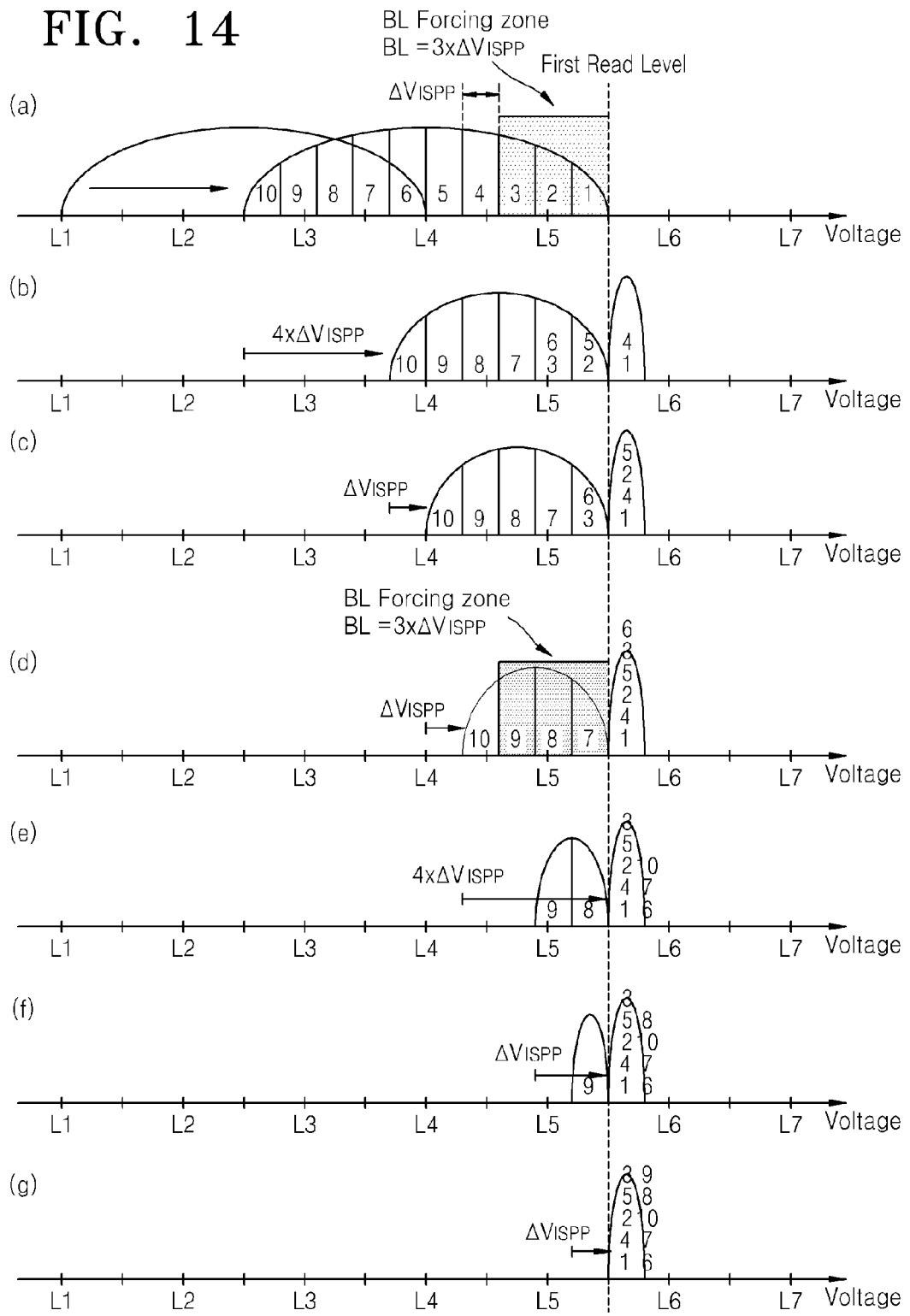
FIGS. 14A to 14G are threshold voltage distribution diagrams of selected memory cells programmed using different numbers of program loops in a programming method according to an embodiment of the inventive concept.

In the examples of FIGS. 13 and 14, a program start voltage Vpgm Start Level is applied to the selected word line in the first program loop, and a bit line program permission voltage V1 is applied to bit lines connected to selected memory cells to be programmed from among memory cells connected to the selected word line. For example, V1 may be 0 V.

FIG. 14A shows a threshold voltage distribution of the selected memory cells to be programmed after the first program loop is performed.

Referring to FIG. 14A, the threshold voltage distribution is divided into 10 regions labeled 1 to 10 based on the unit increment $\Delta V_{ISPP}$. Here, First Read Level denotes a level of the verification voltage for determining a program state.

Thus, where a memory cell has a threshold voltage higher than First Read Level, it is determined that programming of the memory cell has succeeded.

Referring to FIG. 13, the 2-step verification operation is performed based on First Read Level and Second Read Level in the first program loop, and memory cells having a threshold voltage between First Read Level and Second Read Level are bit line forcing cells in a subsequent program loop based on the 2-step verification operation. Because a program voltage increment according to the ISPP hopping method in the second program loop is 4×$\Delta V_{ISPP}$, Second Read Level may be First Read Level−3×$\Delta V_{ISPP}$. In FIG. 14A, the memory cells having a threshold voltage between First Read Level and Second Read Level comprise memory cells classified as regions 1 to 3.

Referring to FIGS. 12 and 13, in the second program loop, the program voltage increased by 4×$\Delta V_{ISPP}$ based on the program start voltage Vpgm Start Level is applied to the selected word line, and forcing voltage 3×$\Delta V_{ISPP}$ is applied to bit lines connected to the memory cells classified as regions 1 to 3 that have a threshold voltage between First Read Level and Second Read Level from among the memory cells connected to the selected word line. In addition, the program permission voltage (0 V) is applied to bit lines connected to memory cells classified as regions 4 to 10 that have a threshold voltage less than Second Read Level from among the memory cells to be programmed.

FIG. 14B shows a threshold voltage distribution of the selected memory cells to be programmed after the second program loop is performed.

As shown in FIGS. 12 and 13, because the program voltage is increased by 4×$\Delta V_{ISPP}$ in the second program loop, threshold voltages of the memory cells classified as regions 4 to 10 are increased by 4×$\Delta V_{ISPP}$. Meanwhile, threshold voltages of the memory cells classified as regions 1 to 3 to which the bit line forcing voltage 3×$\Delta V_{ISPP}$ is applied are increased by $\Delta V_{ISPP}$. Thus, the threshold voltage distribution of the memory cells to be programmed that are connected to the selected word line after the second program loop is performed is as shown in FIG. 14B.

Referring to FIG. 14B, because threshold voltages of the memory cells classified as regions 1 and 4 are higher than First Read Level, the program verification operation succeeds. From a subsequent program loop, the program prohibition voltage will be applied to bit lines connected to the memory cells classified as regions 1 and 4 for which the program verification operation has succeeded. As a result, the memory cells classified as regions 1 and 4 have been completely programmed.

FIG. 14C shows a threshold voltage distribution of the selected memory cells to be programmed after a third program loop is performed.

As shown in FIGS. 12 and 13, because the program voltage is increased by $\Delta V_{ISPP}$ in the third program loop, threshold voltages of the memory cells classified as regions 2, 5, 3, 6, 7, 8, 9, and 10 to be programmed are increased by $\Delta V_{ISPP}$. Thus, the threshold voltage distribution of the memory cells to be programmed that are connected to the selected word line after the third program loop is performed is as shown in FIG. 14C.

Referring to FIG. 14C, because threshold voltages of the memory cells classified as regions 2 and 5 are higher than First Read Level in the third program loop, the program verification operation succeeds. Thus, from a subsequent program loop, the program prohibition voltage will be applied to bit lines connected to the memory cells classified as regions 2 and 5 for which the program verification operation has succeeded. As a result, the memory cells classified as regions 1, 4, 2, and 5 have been completely programmed.

FIG. 14D shows a threshold voltage distribution of the selected memory cells to be programmed after a fourth program loop is performed.

As shown in FIGS. 12 and 13, because the program voltage is increased by $\Delta V_{ISPP}$ in the fourth program loop, threshold voltages of the memory cells classified as regions 3, 6, 7, 8, 9, and 10 to be programmed are increased by $\Delta V_{ISPP}$. Thus, the threshold voltage distribution of the memory cells to be programmed that are connected to the selected word line after the fourth program loop is performed is as shown in FIG. 14D.

Referring to FIG. 14D, because threshold voltages of the memory cells classified as regions 3 and 6 are higher than First Read Level in the fourth program loop, the program verification operation succeeds. Thus, from a subsequent program loop, the program prohibition voltage will be applied to bit lines connected to the memory cells classified as regions 3 and 6 for which the program verification operation has succeeded. As a result, the memory cells classified as regions 1, 4, 2, 5, 3, and 6 have been completely programmed.

Referring again to FIG. 13, the 2-step verification operation is performed based on First Read Level and Second Read Level in the fourth program loop, and memory cells having a threshold voltage between First Read Level and Second Read Level are bit line forcing cells in a subsequent program loop based on the 2-step verification operation.

In FIG. 14D, the memory cells having a threshold voltage between First Read Level and Second Read Level include the memory cells classified as regions 7 to 9.

FIG. 14E shows a threshold voltage distribution of the selected memory cells to be programmed after the fifth program loop is performed.

As shown in FIGS. 12 and 13, because the program voltage is increased by $4 \times \Delta V_{ISPP}$ in the fifth program loop, threshold voltages of the memory cells classified as region 10 are increased by $4 \times \Delta V_{ISPP}$. Meanwhile, threshold voltages of the memory cells classified as regions 7 to 9 to which the bit line forcing voltage $3 \times \Delta V_{ISPP}$ is applied are increased by $\Delta V_{ISPP}$. Thus, the threshold voltage distribution of the memory cells to be programmed that are connected to the selected word line after the fifth program loop is performed is as shown in FIG. 14E. Referring to FIG. 14E, because threshold voltages of the memory cells classified as regions 7 and 10 are higher than First Read Level, the program verification operation succeeds. From a subsequent program loop, the program prohibition voltage will be applied to bit lines connected to the memory cells classified as regions 7 and 10 for which the program verification operation has succeeded. As a result, the memory cells classified as regions 1, 4, 2, 5, 3, 6, 7, and 10 have been completely programmed.

FIG. 14F shows a threshold voltage distribution of the selected memory cells to be programmed after a sixth program loop is performed.

As shown in FIGS. 12 and 13, because the program voltage is increased by $\Delta V_{ISPP}$ in the sixth program loop, threshold voltages of the memory cells classified as regions 8 and 9 to be programmed are increased by $\Delta V_{ISPP}$. Thus, the threshold voltage distribution of the memory cells to be programmed that are connected to the selected word line after the sixth program loop is performed is as shown in FIG. 14F. Referring to FIG. 14F, because threshold voltages of the memory cells classified as region 8 are higher than First Read Level in the sixth program loop, the program verification operation succeeds. Thus, in a subsequent program loop, the program prohibition voltage is applied to bit lines connected to the memory cells classified as region 8 for which the program verification operation has succeeded. As a result, the memory cells classified as regions 1, 4, 2, 5, 3, 6, 7, 10 and 8 have been completely programmed.

FIG. 14G illustrates a threshold voltage distribution of the selected memory cells to be programmed after a seventh program loop is performed.

As shown in FIGS. 12 and 13, because the program voltage is increased by $\Delta V_{ISPP}$ in the seventh program loop, threshold voltages of the memory cells classified as region 9 to be programmed are increased by $\Delta V_{ISPP}$. Thus, the threshold voltage distribution of the memory cells to be programmed that are connected to the selected word line after the seventh program loop is performed is as shown in FIG. 14G. Referring to FIG. 14G, because threshold voltages of the memory cells classified as region 9 are higher than First Read Level in the seventh program loop, the program verification operation succeeds. As shown in FIG. 14G, because all of the memory cells to be programmed that are connected to the selected word line have been completely programmed, the program operation ends. Referring to FIG. 14, programming is completed by a total of 7 program loops.

FIG. 15 is a diagram of a program voltage generated in the programming method according to another embodiment of the inventive concept.

Referring to FIG. 15, the program voltage is a program start voltage in a first program loop, increased by $5 \times \Delta V_{ISPP}$ based on the program voltage applied to a previous program loop in a second program loop, increased by $4 \times \Delta V_{ISPP}$ based on the program voltage applied to a previous program loop in a sixth program loop, and increased by $\Delta V_{ISPP}$ in the other program loops.

By comparison, while increments in the program loops to which the ISPP hopping method is applied are equally $4 \times \Delta V_{ISPP}$ in FIGS. 12 to 14, increments in the program loops to which the ISPP hopping method is applied are differently determined according to the program loops.

Figure 16:
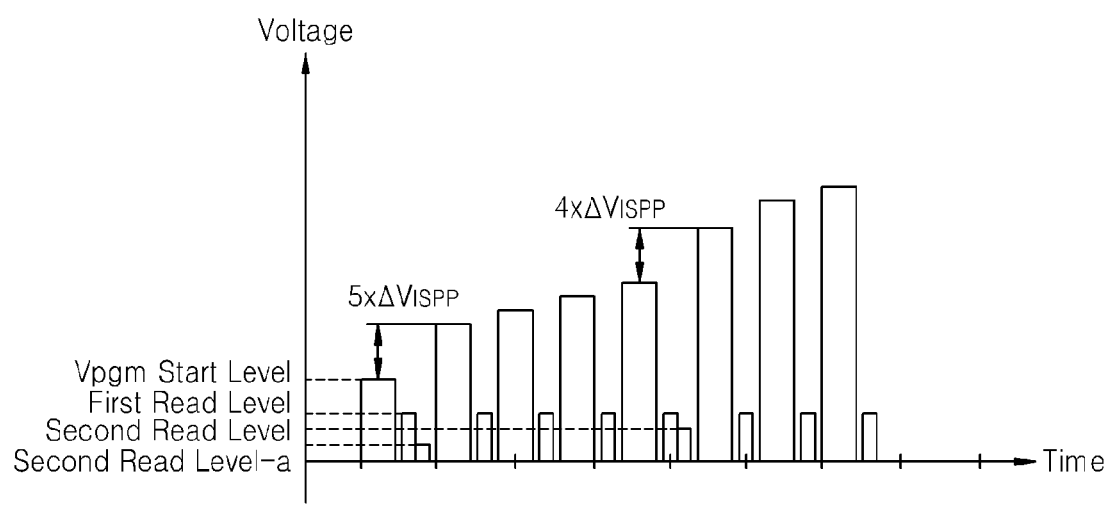
FIG. 16 is a diagram of a voltage applied to a selected word line in a programming method according to an embodiment of the inventive concept.

FIG. 16 is a diagram of voltages applied to a word line selected to be programmed in the programming method according to another embodiment of the inventive concept. That is, FIG. 16 shows both a program voltage and a verification voltage. FIGS. 17A to 17H are threshold voltage distribution diagrams of memory cells varied according to the number of program loops when programming is performed in a programming method according to another embodiment of the inventive concept.

Figure 17:
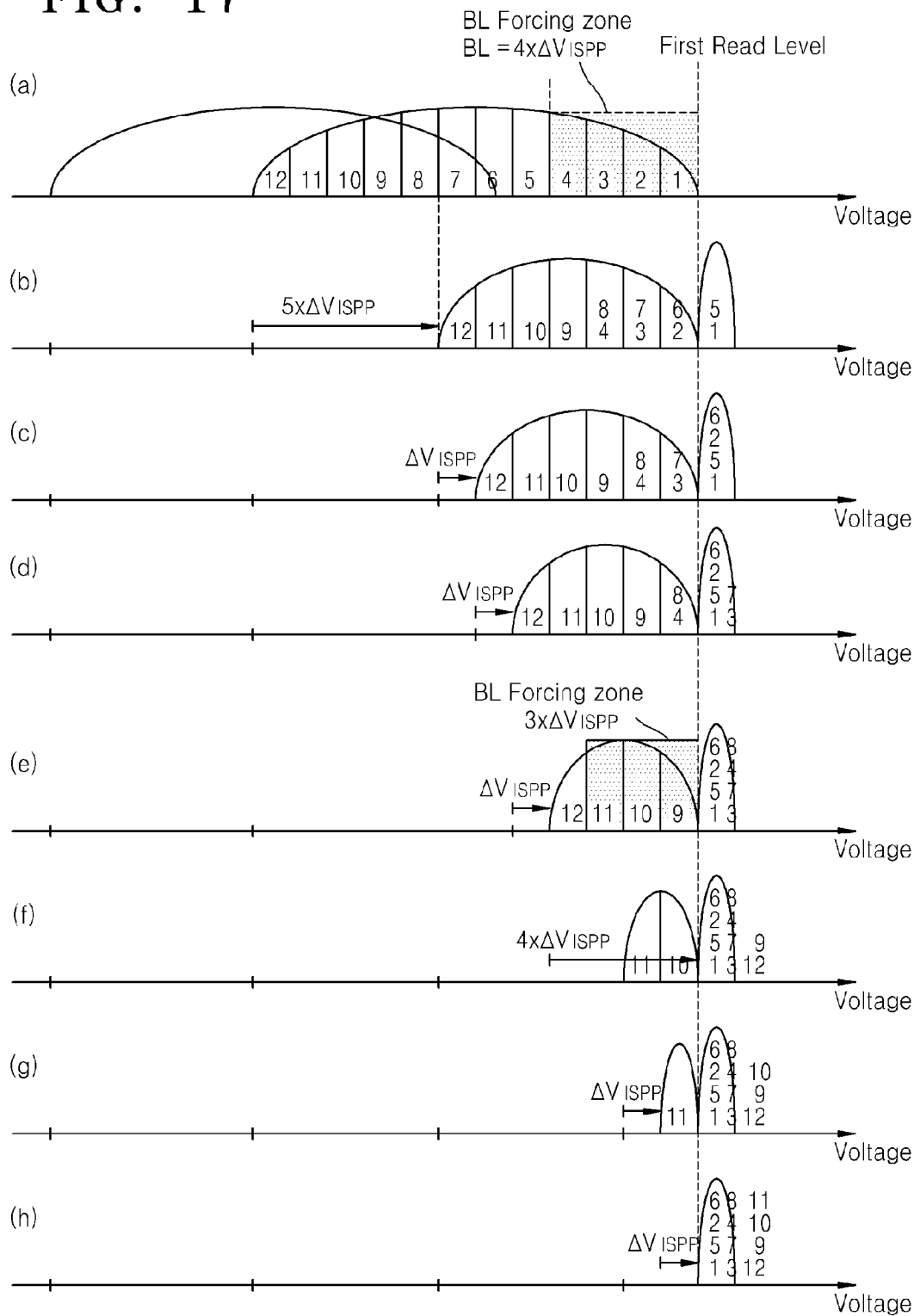
FIGS. 17A to 17H are threshold voltage distribution diagrams of selected memory cells programmed using different numbers of program loops in a programming method according to an embodiment of the inventive concept.

In the examples of FIGS. 16 and 17, the program start voltage Vpgm Start Level is applied to the selected word line in the first program loop, and a bit line program permission voltage V1 is applied to bit lines connected to memory cells to be programmed from among memory cells connected to the selected word line. For example, V1 may be 0 V.

FIG. 17A shows a threshold voltage distribution of the memory cells to be programmed that are connected to the selected word line after the first program loop is performed.

Referring to FIG. 17A, the threshold voltage distribution is divided into 12 regions 1 to 12 based on the unit increment $\Delta V_{ISPP}$ of the program voltage. Here, First Read Level denotes a level of the verification voltage for determining a program state. Thus, when a memory cell has a threshold voltage higher than First Read Level, it is determined that programming of the memory cell has succeeded.

Referring again to FIG. 16, the 2-step verification operation is performed based on First Read Level and Second Read Level in the first program loop, and memory cells having a threshold voltage between First Read Level and Second Read Level–a are bit line forcing cells in a subsequent program loop based on the 2-step verification operation. Because a program voltage increment according to the ISPP hopping method in the second program loop is $5\times\Delta V_{ISPP}$, Second Read Level-a may be First Read Level-$4\times\Delta V_{ISPP}$.

Referring to FIG. 17A, the memory cells having a threshold voltage between First Read Level and Second Read Level-a include memory cells classified as regions 1 to 4.

Referring to FIGS. 15 and 17A, in the second program loop, the program voltage increased by $5\times\Delta V_{ISPP}$ based on the program start voltage Vpgm Start Level is applied to the selected word line, and forcing voltage $4\times\Delta V_{ISPP}$ is applied to bit lines connected to the memory cells classified as regions 1 to 4 that have a threshold voltage between First Read Level and Second Read Level-a from among the memory cells connected to the selected word line. In addition, the program permission voltage (e.g., 0 V) is applied to bit lines connected to memory cells classified as regions 5 to 12 that have a threshold voltage less than Second Read Level-a from among the memory cells to be programmed.

FIG. 17B shows a threshold voltage distribution of the memory cells to be programmed that are connected to the selected word line after the second program loop is performed. As shown in FIGS. 15 and 16, because the program voltage is increased by $5\times\Delta V_{ISPP}$ in the second program loop, threshold voltages of the memory cells classified as regions 5 to 12 are increased by $5\times\Delta V_{ISPP}$. Meanwhile, threshold voltages of the memory cells classified as regions 1 to 4 to which the bit line forcing voltage $4\times\Delta V_{ISPP}$ is applied are increased by $\Delta V_{ISPP}$. Thus the threshold voltage distribution of the memory cells to be programmed that are connected to the selected word line after the second program loop is performed is as shown in FIG. 17B.

Referring to FIG. 17B, because threshold voltages of the memory cells classified as regions 1 and 5 are higher than First Read Level, the program verification operation succeeds. From a subsequent program loop, the program prohibition voltage will be applied to bit lines connected to the memory cells classified as regions 1 and 5 for which the program verification operation has succeeded. As a result, the memory cells classified as regions 1 and 5 have been completely programmed.

FIG. 17C shows a threshold voltage distribution of the memory cells to be programmed that are connected to the selected word line after a third program loop is performed. As shown in FIGS. 15 and 16, because the program voltage is increased by $\Delta V_{ISPP}$ in the third program loop, threshold voltages of the memory cells classified as regions 2, 6, 3, 7, 4, 8, 9, 10, 11, and 12 to be programmed are increased by $\Delta V_{ISPP}$. Thus the threshold voltage distribution of the memory cells to be programmed that are connected to the selected word line after the third program loop is performed is as shown in FIG. 17C.

Referring to FIG. 17C, because threshold voltages of the memory cells classified as regions 2 and 6 are higher than First Read Level in the third program loop, the program verification operation succeeds. Thus, from a subsequent program loop, the program prohibition voltage will be applied to bit lines connected to the memory cells classified as regions 2 and 6 for which the program verification operation has succeeded. As a result, the memory cells classified as regions 1, 5, 2, and 6 have been completely programmed.

FIG. 17D shows a threshold voltage distribution of the memory cells to be programmed that are connected to the selected word line after a fourth program loop is performed. As shown in FIGS. 15 and 16, because the program voltage is increased by $\Delta V_{ISPP}$ in the fourth program loop, threshold voltages of the memory cells classified as regions 3, 7, 4, 8, 9, 10, 11, and 12 to be programmed are increased by $\Delta V_{ISPP}$. Thus, the threshold voltage distribution of the memory cells to be programmed that are connected to the selected word line after the fourth program loop is performed is as shown in FIG. 17D.

Referring to FIG. 17D, because threshold voltages of the memory cells classified as regions 3 and 7 are higher than First Read Level in the fourth program loop, the program verification operation succeeds. Thus, from a subsequent program loop, the program prohibition voltage will be applied to bit lines connected to the memory cells classified as regions 3 and 7 for which the program verification operation has succeeded. As a result, the memory cells classified as regions 1, 5, 2, 6, 3, and 7 have been completely programmed.

FIG. 17E shows a threshold voltage distribution of the memory cells to be programmed that are connected to the selected word line after a fifth program loop is performed. As shown in FIGS. 15 and 16, because the program voltage is increased by $\Delta V_{ISPP}$ in the fifth program loop, threshold voltages of the memory cells classified as region 4, 8, 9, 10, 11, and 12 to be programmed are increased by $\Delta V_{ISPP}$. Thus the threshold voltage distribution of the memory cells to be programmed that are connected to the selected word line after the fifth program loop is performed is as shown in FIG. 17E.

Referring to FIG. 17E, because threshold voltages of the memory cells classified as regions 4 and 8 are higher than First Read Level, the program verification operation succeeds. From a subsequent program loop, the program prohibition voltage will be applied to bit lines connected to the memory cells classified as regions 4 and 8 for which the program verification operation has succeeded. As a result, the memory cells classified as regions 1, 5, 2, 6, 3, 7, 4, and 8 have been completely programmed.

Referring to FIG. 16, the 2-step verification operation is performed based on First Read Level and Second Read Level in the fifth program loop, and memory cells having a threshold voltage between First Read Level and Second Read Level are bit line forcing cells in a subsequent program loop based on the 2-step verification operation. Because a program voltage increment according to the ISPP hopping method in the sixth program loop is $4\times\Delta V_{ISPP}$, Second Read Level may be First Read Level-$3\times\Delta V_{ISPP}$.

Referring to FIG. 17E, memory cells having a threshold voltage between First Read Level and Second Read Level include the memory cells classified as regions 9 to 11.

FIG. 17F shows a threshold voltage distribution of the memory cells to be programmed that are connected to the selected word line after the sixth program loop is performed. As shown in FIGS. 15 and 16, because the program voltage is increased by $4\times\Delta V_{ISPP}$ in the sixth program loop, threshold voltages of the memory cells classified as region 12 are increased by $4\times\Delta V_{ISPP}$. Meanwhile, threshold voltages of the memory cells classified as regions 9 to 11 to which the bit line forcing voltage $3\times\Delta V_{ISPP}$ is applied are increased by $\Delta V_{ISPP}$. Thus the threshold voltage distribution of the memory cells to be programmed that are connected to the selected word line after the sixth program loop is performed is as shown in FIG. 17F.

Referring to FIG. 17F, because threshold voltages of the memory cells classified as regions 12 and 9 are higher than First Read Level, the program verification operation succeeds. From a subsequent program loop, the program prohibition voltage will be applied to bit lines connected to the memory cells classified as regions 12 and 9 for which the program verification operation has succeeded. As a result, the memory cells classified as regions 1, 5, 2, 6, 3, 7, 4, 8, 12, and 9 have been completely programmed.

FIG. 17G shows a threshold voltage distribution of the selected memory cells to be programmed after a seventh program loop is performed. As shown in FIGS. 15 and 16, because the program voltage is increased by $\Delta V_{ISPP}$ in the seventh program loop, threshold voltages of the memory cells classified as regions 10 and 11 to be programmed are increased by $\Delta V_{ISPP}$. Thus the threshold voltage distribution of the memory cells to be programmed that are connected to the selected word line after the seventh program loop is performed is as shown in FIG. 17G.

Referring to FIG. 17G, because threshold voltages of the memory cells classified as region 10 are higher than First Read Level in the seventh program loop, the program verification operation succeeds. Thus, from a subsequent program loop, the program prohibition voltage will be applied to bit lines connected to the memory cells classified as region 10 for which the program verification operation has succeeded. As a result, the memory cells classified as regions 1, 5, 2, 6, 3, 7, 4, 8, 12, 9, and 10 have been completely programmed.

FIG. 17H shows a threshold voltage distribution of the selected memory cells to be programmed that are connected to the selected word line after an eighth program loop. As shown in FIGS. 15 and 16, because the program voltage is increased by $\Delta V_{ISPP}$ in the eighth program loop, threshold voltages of the memory cells classified as region 11 to be programmed are increased by $\Delta V_{ISPP}$. Thus the threshold voltage distribution of the memory cells to be programmed that are connected to the selected word line after the eighth program loop is performed is as shown in FIG. 17H.

Referring to FIG. 17H, because threshold voltages of the memory cells classified as region 11 are higher than First Read Level in the eighth program loop, the program verification operation succeeds. As shown in FIG. 17H, because all the memory cells to be programmed that are connected to the selected word line have been completely programmed, the program operation ends. Referring to FIG. 17, programming is completed by a total of 8 program loops.

Figure 18:
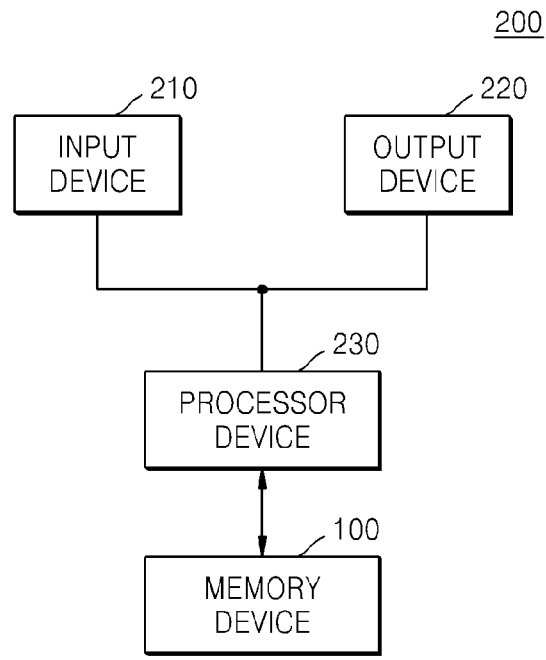
FIG. 18 is a block diagram of an electronic system incorporating a nonvolatile memory device according to an embodiment of the inventive concept.

FIG. 18 is a block diagram of an electronic system 200 incorporating nonvolatile memory device 100 according to an embodiment of the inventive concept.

Referring to FIG. 18, electronic system 200 comprises an input device 210, an output device 220, a processor device 230, and nonvolatile memory device 100. Processor device 230 controls input device 210, output device 220, and nonvolatile memory device 100 through respective interfaces. Processor device 230 comprises at least one of at least one microprocessor, a digital signal processor, a micro controller, and logic devices capable of performing a similar function of them. Input device 210 and output device 220 may comprise, for example, a keypad, a keyboard, or a display device.

Nonvolatile memory device 100 comprises a memory cell array, a voltage generator for generating a program voltage applied to a selected word line of memory cells and a voltage applied to a bit line, and a control logic unit for determining a magnitude of the program voltage by selecting one of a plurality of increments of the program voltage according to the number of program loops. In addition, nonvolatile memory device 100 may comprise firmware required to perform the program operation according to the method shown in FIG. 4, 5, 9, 10, or 11.

Figure 19:
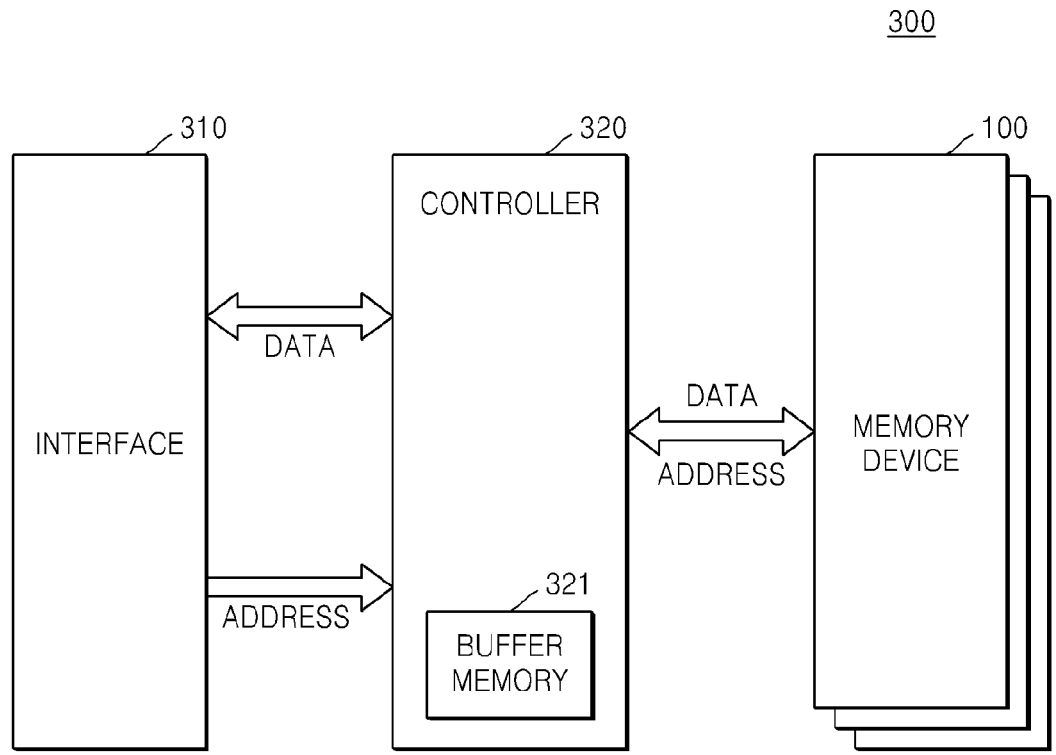
FIG. 19 is a block diagram of a memory system incorporating a nonvolatile memory device according to an embodiment of the inventive concept.

FIG. 19 is a block diagram of a memory system 300 incorporating nonvolatile memory device 100 according to an embodiment of the inventive concept.

Referring to FIG. 19, memory system 300 comprises an interface unit 310, a controller 320, and nonvolatile memory device 100. Interface unit 310 provides an interface between memory system 300 and a host device (not shown). Interface unit 310 implements a data exchange protocol corresponding to the host device to interface with the host device. Interface unit 310 can be configured to communicate with the host device through one of various interface protocols, such as Universal Serial Bus (USB), Multi-Media Card (MMC), Peripheral Component Interconnect-Express (PCI-E), Serial-attached SCSI (SAS), Serial Advanced Technology Attachment (SATA), Parallel Advanced Technology Attachment (PATA), Small Computer System Interface (SCSI), Enhanced Small Disk Interface (ESDI), and Integrated Drive Electronics (IDE).

Controller 320 receives data and an address provided from the outside through interface unit 310. Controller 320 may access nonvolatile memory device 100 by referring to the data and the address provided from the host device. Controller 320 transmits data read from nonvolatile memory device 100 to the host device via interface unit 310.

Controller 320 comprises a buffer memory 321. Buffer memory 321 temporarily stores write data provided from the host device or data read from nonvolatile memory device 100. When a read request is received from the host device, if data stored in nonvolatile memory device 100 is cached, buffer memory 321 supports a cache function of directly providing the cached data to the host device. In general, a data transfer speed for a particular bus format (e.g., SATA or SAS) of the host device may be much faster than a transfer speed of a memory channel in memory system 300. Where an interface speed of the host device is significantly faster than the transfer speed of the memory channel in memory system 300, performance deterioration caused by the speed difference may be minimized by providing buffer memory 321.

Nonvolatile memory device 100 typically comprises a memory cell array, a voltage generator for generating a program voltage applied to a selected word line of memory cells and a voltage applied to a bit line, and a control logic unit for determining a magnitude of the program voltage by selecting one of a plurality of increments of the program voltage according to the number of program loops. In addition, nonvolatile memory device 100 may comprise firmware required to perform the program operation according to the method shown in FIG. 4, 5, 9, 10, or 11. Nonvolatile memory device 100 may be provided as a storage medium of memory system 300.

Figure 20:
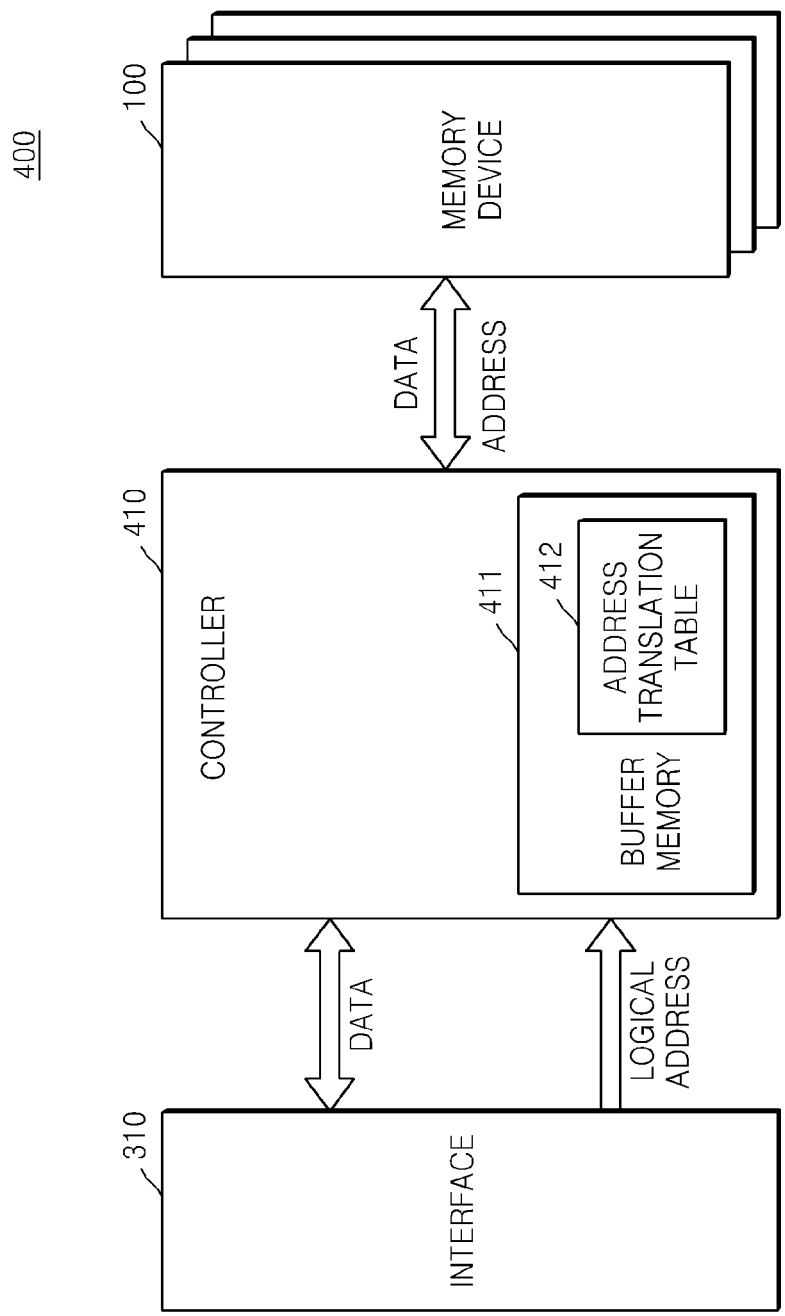
FIG. 20 is a block diagram of a memory system incorporating a nonvolatile memory device according to another embodiment of the inventive concept.

FIG. 20 is a block diagram of a memory system 400 incorporating nonvolatile memory device 100 according to another embodiment of the inventive concept.

Referring to FIG. 20, memory system 400 may comprise interface unit 310, a controller 410, and nonvolatile memory device 100. Interface unit 310 implements a data exchange protocol corresponding to a host device to interface with the host device. nonvolatile memory device 100 may comprise a memory cell array, a voltage generator for generating a program voltage applied to a selected word line of memory cells and a voltage applied to a bit line, and a control logic unit for determining a magnitude of the program voltage by selecting one of a plurality of increments of the program voltage according to the number of program loops. In addition, nonvolatile memory device 100 may comprise firmware required to perform the program operation according to the method shown in FIG. 4, 5, 9, 10, or 11.

Nonvolatile memory device 100 may be applied to a solid state disk (SSD). Memory system 400 may be called a flash memory system. The SSD is a data storage device using memory chips, such as flash memories, to store data instead of a magnetic disk used in general hard disk drives. The SSD is faster than a hard disk drive operating mechanically, is robust against an external impact, and has low power consumption.

Controller 410 may comprise a buffer memory 411 having an address translation table 412. Controller 410 may translate a logical address provided by interface unit 310 to a physical address by referring to address translation table 412. Controller 410 may access nonvolatile memory device 100 by referring to the translated physical address.

Memory system 300 or 400 shown in FIG. 19 or 20 may be embedded in information processing devices, such as personal digital assistants (PDAs), portable computers, web tablets, digital cameras, portable media players (PMPs), mobile phones, wireless phones, laptop computers, and the like. Memory system 300 or 400 may be implemented as a secure digital (SD) card, a micro SD card, a memory stick, an identification (ID) card, a Personal Computer Memory Card International Association (PCMCIA) card, a chip card, a USB card, a smart card, and a compact flash (CF) card.

Figure 21:
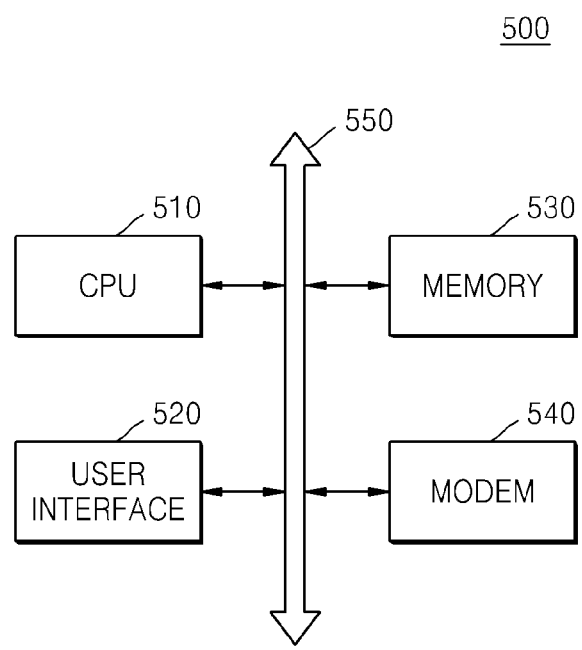
FIG. 21 is a block diagram of a computer system incorporating a nonvolatile memory device according to an embodiment of the inventive concept.

FIG. 21 is a block diagram of a computer system 500 comprising a nonvolatile memory device according to embodiments of the inventive concept.

Referring to FIG. 21, computer system 500 comprises a central processing unit (CPU) 510, a user interface 520, a memory 530, and a modem 540, such as a baseband chipset, that are electrically connected to a system bus 550. User interface 520 may be an interface for transmitting or received data to or from a communication network. User interface 520 may be a wired/wireless type and comprise an antenna or a wired/wireless transceiver. Data provided through user interface 520 or modem 540 or processed by CPU 510 may be stored in memory 530.

Memory 530 may comprise a volatile memory device such as a dynamic random access memory (DRAM) and/or a nonvolatile memory device such as a flash memory. Memory 530 may comprise a memory cell array, a voltage generator for generating a program voltage applied to a selected word line of memory cells and a voltage applied to a bit line, and a control logic unit for determining a magnitude of the program voltage by selecting one of a plurality of increments of the program voltage according to the number of program loops. In addition, memory 530 may comprise firmware required to perform the program operation according to the method shown in FIG. 4, 5, 9, 10, or 11.

Where computer system 500 is a mobile device, a battery (not shown) for supplying an operation voltage of computer system 500 may be additionally provided. Although not shown, computer system 500 may further comprise an application chipset, a camera image processor (CIP), and an input and output device.

Where computer system 500 is a device for performing wireless communication, computer system 500 may be used in communication systems, such as Code Division Multiple Access (CDMA), Global System for Mobile communication (GSM), and North American Multiple Access (NADC).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a nonvolatile memory device, comprising:
performing a plurality of program loops each comprising applying a program voltage to a selected wordline to change a threshold voltage of a selected memory cell, and applying a verification voltage to the selected wordline to verify a program state of the selected memory cell, and in each program loop, determining a program condition and incrementing the program voltage by an amount determined according to the program condition;
wherein the amount is determined by selecting a second increment for each program loop of a specific category and selecting a first increment for each program loop not of the specific category, wherein the second increment is greater than the first increment.

2. The method of claim 1, further comprising varying a voltage supplied to a bit line connected to the selected memory cell according to the program condition and a threshold voltage distribution of memory cells in the nonvolatile memory device.

3. The method of claim 1, wherein the program condition comprises a number of program loops that have been performed on the selected memory cell.

4. The method of claim 1, wherein the second increment varies according to different program loops in the specific category.

5. The method of claim 1, wherein the second increment is an integer multiple of the first increment.

6. The method of claim 1, further comprising, in a program loop using the second increment, supplying a third voltage to a bit line connected to the selected memory cell upon determining that the selected memory cell has a threshold voltage between a first voltage and a second voltage, and supplying a fourth voltage to the bit line upon determining that the selected memory cell has a threshold voltage less than the second voltage.

7. The method of claim 6, further comprising, in a program loop immediately preceding the program loop using the second increment, determining whether the selected memory cell has the threshold voltage between the first voltage and the second voltage by performing a 2-step verification process in which the first voltage and the second voltage are applied in respective steps as a read voltage.

8. The method of claim 6, wherein the first voltage is a verification voltage for determining a program state of a memory cell, the second voltage is lower than the first voltage, and the third voltage is higher than the fourth voltage.

9. The method of claim 6, wherein the second increment is N times the first increment, where N is a positive integer, a difference between the first voltage and the second voltage is (N−1) times the first increment, and a difference between the third voltage and the fourth voltage is (N−1) times the first increment.

10. The method of claim 6, further comprising, following the program loop using the second increment, performing (N−2) consecutive program loops using the first increment.

11. A nonvolatile memory device, comprising:
a memory cell array comprising memory cells connected to word lines and bit lines;
a voltage generator that generates a program voltage to be applied to a selected word line and a voltage to be applied to a selected bit line, wherein the selected word line and the selected bit line are connected to a selected memory cell to be programmed; and
a control logic unit that determines a magnitude of the program voltage by selecting one of a plurality of increments of the program voltage according to a number of program loops that have been performed in a current program operation;
wherein the control logic unit determines the magnitude of the program voltage by selecting a second increment for program loops of a specific category and selecting a first increment for program loops not of the specific category, wherein the second increment is larger than the first increment.

12. The nonvolatile memory device of claim 11, wherein the control logic unit varies the voltage supplied to the selected bit line cell according to the number of program loops and a threshold voltage distribution of the memory cells.

13. The nonvolatile memory device of claim 11, wherein in a program loop corresponding using the second increment, a third voltage is supplied to the selected bit line where the selected memory cell has a threshold voltage between a first voltage and a second voltage, and a fourth voltage is supplied to the selected bit line where the selected memory cell has a threshold voltage less than the second voltage, and wherein the first voltage is a verification voltage for determining a program state of a memory cell, and the second voltage is lower than the first voltage.

14. A method of programming a nonvolatile memory device using incremental step pulse programming (ISPP), comprising:

determining whether a next program loop of the ISPP satisfies a program condition;

upon determining that the next program loop satisfies the program condition, performing the next program loop with an ISPP hopping method and a bit line forcing method; and upon determining that the next program loop does not satisfy the program condition, performing the next program loop with a normal ISPP method;

wherein the normal ISPP method increases a program voltage by a first increment and the ISPP hopping method increases the program voltage by a second increment N times greater than then first increment, where N is a positive integer.

15. The method of claim 14, wherein the program condition is characterized by a predetermined number of program loops being completed in a current program operation.

16. The method of claim 14, wherein the program condition is characterized by a predetermined number of program prohibition memory cells being connected to a selected word line.

17. The method of claim 14, wherein the program condition is characterized by a predetermined distribution of threshold voltages of memory cells connected to a selected word line.

* * * * *